(12) United States Patent
Lee et al.

(10) Patent No.: US 12,471,460 B2
(45) Date of Patent: Nov. 11, 2025

(54) DISPLAY APPARATUS INCLUDING A PAD AT A NON-DISPLAY AREA OVERLAPPING WITH A CONDUCTOR CONNECTING A CONDUCTIVE LINE TO THE PAD

(71) Applicant: Samsung Display Co., Ltd., Yongin-si (KR)

(72) Inventors: Soyoung Lee, Yongin-si (KR); Daesuk Kim, Yongin-si (KR); Yanghee Kim, Yongin-si (KR); Hyunchol Bang, Yongin-si (KR); Youngsoo Yoon, Yongin-si (KR); Ilgoo Youn, Yongin-si (KR); Bongwon Lee, Yongin-si (KR); Sukyo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 539 days.

(21) Appl. No.: 17/879,590

(22) Filed: Aug. 2, 2022

(65) Prior Publication Data
US 2023/0309351 A1   Sep. 28, 2023

(30) Foreign Application Priority Data
Feb. 7, 2022   (KR) ........................ 10-2022-0015762

(51) Int. Cl.
*H10K 59/131* (2023.01)
*G09G 3/3233* (2016.01)
*H01L 23/00* (2006.01)

(52) U.S. Cl.
CPC ......... *H10K 59/131* (2023.02); *G09G 3/3233* (2013.01); *H01L 24/05* (2013.01);
(Continued)

(58) Field of Classification Search
CPC ............. H10K 59/131; H10K 59/1213; H10K 59/1216; H10K 59/122; H10K 59/1315;
(Continued)

(56) References Cited

U.S. PATENT DOCUMENTS 8,928,597 B2   1/2015 Jang
11,177,340 B2   11/2021 Kim et al.
(Continued)

FOREIGN PATENT DOCUMENTS

KR  10-2017-0006461 A    1/2017
KR  10-2020-0128253 A   11/2020
(Continued)

*Primary Examiner* — Christine S. Kim
*Assistant Examiner* — Andrew Victor Prostor
(74) *Attorney, Agent, or Firm* — Womble Bond Dickinson (US) LLP

(57) ABSTRACT

A display apparatus includes: a substrate; a plurality of sub-pixel circuits on the substrate, each of the plurality of sub-pixel circuits including at least one transistor; a plurality of light-emitting diodes electrically connected to the plurality of sub-pixel circuits, respectively, and defining a display area; a pad at a non-display area outside the display area; a conductive line extending toward a first edge of the substrate; and a conductor electrically connecting the conductive line to the pad. The conductor overlaps with the pad, is interposed between a part of the conductive line and a part of the pad, and has an isolated shape in a plan view.

20 Claims, 14 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *H01L 24/06* (2013.01); *H01L 24/29* (2013.01); *H01L 24/32* (2013.01); *H01L 2224/05012* (2013.01); *H01L 2224/05013* (2013.01); *H01L 2224/05018* (2013.01); *H01L 2224/05027* (2013.01); *H01L 2224/05082* (2013.01); *H01L 2224/05124* (2013.01); *H01L 2224/05147* (2013.01); *H01L 2224/05166* (2013.01); *H01L 2224/05552* (2013.01); *H01L 2224/05553* (2013.01); *H01L 2224/05558* (2013.01); *H01L 2224/05562* (2013.01); *H01L 2224/05567* (2013.01); *H01L 2224/05624* (2013.01); *H01L 2224/05647* (2013.01); *H01L 2224/05666* (2013.01); *H01L 2224/06051* (2013.01); *H01L 2224/06155* (2013.01); *H01L 2224/2929* (2013.01); *H01L 2224/29499* (2013.01); *H01L 2224/32013* (2013.01); *H01L 2224/32227* (2013.01)

(58) Field of Classification Search
CPC .... H10K 50/805; H10K 59/124; H10K 71/70; G09G 3/3233; G09G 2300/0426; G09G 2300/0819; G09G 2300/0842; G09G 2300/0861; G09G 2310/0251; H01L 24/05; H01L 24/06; H01L 24/29; H01L 24/32; H01L 2224/05012; H01L 2224/05013; H01L 2224/05018; H01L 2224/05027; H01L 2224/05082; H01L 2224/05124; H01L 2224/05147; H01L 2224/05166; H01L 2224/05552; H01L 2224/05553; H01L 2224/05558; H01L 2224/05562; H01L 2224/05567; H01L 2224/05624; H01L 2224/05647; H01L 2224/05666; H01L 2224/06051; H01L 2224/06155; H01L 2224/2929; H01L 2224/29499; H01L 2224/32013; H01L 2224/32227

See application file for complete search history.

(56) References Cited

U.S. PATENT DOCUMENTS

| | | |
|---|---|---|
| 2020/0350390 A1 | 11/2020 | Kim et al. |
| 2020/0411625 A1* | 12/2020 | Seo ................. G02F 1/1345 |
| 2021/0134877 A1 | 5/2021 | Kim et al. |
| 2021/0265437 A1* | 8/2021 | Son ................. H10K 59/131 |
| 2022/0037445 A1* | 2/2022 | Cho ................. H10K 59/131 |
| 2022/0216276 A1* | 7/2022 | Lee ................. H10K 50/844 |

FOREIGN PATENT DOCUMENTS

| | | |
|---|---|---|
| KR | 10-2021-0018687 A | 2/2021 |
| KR | 10-2021-0054117 A | 5/2021 |

\* cited by examiner

DISPLAY APPARATUS INCLUDING A PAD AT A NON-DISPLAY AREA OVERLAPPING WITH A CONDUCTOR CONNECTING A CONDUCTIVE LINE TO THE PAD

CROSS-REFERENCE TO RELATED APPLICATION

This application claims priority to and the benefit of Korean Patent Application No. 10-2022-0015762, filed on Feb. 7, 2022, in the Korean Intellectual Property Office, the entire disclosure of which is incorporated by reference herein.

BACKGROUND

1. Field

Aspects of one or more embodiments relate to a display apparatus.

2. Description of the Related Art

In general, a display apparatus, such as an organic light-emitting display apparatus, includes thin-film transistors that are located in a display area to control a luminance of a light-emitting diode or the like. The thin-film transistors control a corresponding light-emitting diode to emit light of a certain color by using a transmitted data signal, a driving voltage, and a common voltage.

A non-display area where light for providing an image is not emitted is located outside the display area where light-emitting diodes are located to provide an image. A pad for connection to a circuit board may be located in the non-display area.

The above information disclosed in this Background section is for enhancement of understanding of the background of the present disclosure, and therefore, it may contain information that does not constitute prior art.

SUMMARY

One or more embodiments of the present disclosure are directed to a display apparatus including a pad, and a structure around the pad.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate; a plurality of sub-pixel circuits on the substrate, each of the plurality of sub-pixel circuits including at least one transistor; a plurality of light-emitting diodes electrically connected to the plurality of sub-pixel circuits, respectively, and defining a display area; a pad at a non-display area outside the display area; a conductive line extending toward a first edge of the substrate; and a conductor electrically connecting the conductive line to the pad. The conductor overlaps with the pad, is interposed between a part of the conductive line and a part of the pad, and has an isolated shape in a plan view.

In an embodiment, an entirety of a top surface of the conductor may directly contact the pad.

In an embodiment, the pad may include: a first pad layer on the conductor; and a second pad layer on the first pad layer.

In an embodiment, the display apparatus may further include at least one inorganic insulating layer between the conductor and the conductive line, and the conductor may be connected to the conductive line through a contact hole penetrating the at least one inorganic insulating layer.

In an embodiment, the first pad layer may extend past an edge of the conductor, and a side surface of the conductor corresponding to the edge of the conductor may be covered by the first pad layer.

In an embodiment, the second pad layer may extend past an edge of the first pad layer, and a side surface of the first pad layer corresponding to the edge of the first pad layer may be covered by the second pad layer.

In an embodiment, an edge of the conductive line and the first edge of the substrate may be aligned with each other.

In an embodiment, the display apparatus may further include an insulating layer covering an outer area of the pad, and having an opening exposing a part of the pad.

In an embodiment, an edge of the insulating layer adjacent to the first edge of the substrate may be spaced from the first edge of the substrate.

In an embodiment, each of the plurality of sub-pixel circuits may include: a driving transistor including a driving semiconductor layer, and a driving gate electrode on the driving semiconductor layer; and a storage capacitor including a first electrode overlapping with the driving semiconductor layer of the driving transistor, and a second electrode on the first electrode. Each of the plurality of sub-pixel circuits may be electrically connected to: a corresponding driving voltage line; and a corresponding data line located on the corresponding driving voltage line and underneath a first electrode of a corresponding light-emitting diode of the plurality of light-emitting diodes, and the insulating layer and an organic insulating layer located between the corresponding data line and the first electrode may include a same material as each other.

In an embodiment, each of the plurality of sub-pixel circuits may further include a compensation transistor electrically connected to the driving transistor through a node connection line, and the conductor may be located at a same layer as that of the node connection line.

According to one or more embodiments of the present disclosure, a display apparatus includes: a substrate; a plurality of sub-pixel circuits on the substrate, each of the sub-pixel circuits including at least one transistor; a plurality of light-emitting diodes electrically connected to the plurality of sub-pixel circuits, respectively, and defining a display area; a pad at a non-display area outside the display area, and including a first pad layer and a second pad layer; a conductive line extending toward a first edge of the substrate; and a conductor electrically connecting the conductive line to the pad. The conductor overlaps with the first pad layer and the second pad layer, is interposed between a part of the conductive line and a part of the pad, and has an isolated shape in a plan view.

In an embodiment, a contact area between a bottom surface of the conductor and the conductive line may be smaller than a contact area between a top surface of the conductor and the pad.

In an embodiment, the second pad layer may directly contact an entirety of a top surface of the first pad layer, and the first pad layer may directly contact an entirety of a top surface of the conductor.

In an embodiment, the display apparatus may further include at least one inorganic insulating layer between the conductor and the conductive line, and the conductor may be connected to the conductive line through a contact hole penetrating the at least one inorganic insulating layer.

In an embodiment, the first pad layer may extend past edges of the conductor, and side surfaces of the conductor corresponding to the edges of the conductor may be covered by the first pad layer.

In an embodiment, the second pad layer may extend past an edge of the first pad layer, and a side surface of the first pad layer corresponding to the edge of the first pad layer may be covered by the second pad layer.

In an embodiment, an edge of the conductive line and the first edge of the substrate may be aligned with each other.

In an embodiment, the display apparatus may further include an insulating layer covering an outer area of the pad, and having an opening exposing a part of the pad, and an edge of the insulating layer adjacent to the first edge of the substrate may be spaced from the first edge of the substrate.

In an embodiment, each of the plurality of sub-pixel circuits may include: a driving transistor including a driving semiconductor layer, and a driving gate electrode on the driving semiconductor layer; and a storage capacitor including a first electrode overlapping with the driving semiconductor layer of the driving transistor, and a second electrode on the first electrode. Each of the plurality of sub-pixel circuits may be electrically connected to: a corresponding driving voltage line; and a corresponding data line located on the corresponding driving voltage line, and underneath a first electrode of a corresponding light-emitting diode of the plurality of light-emitting diodes, and the insulating layer and an organic insulating layer located between the corresponding data line and the first electrode may include a same material as each other.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
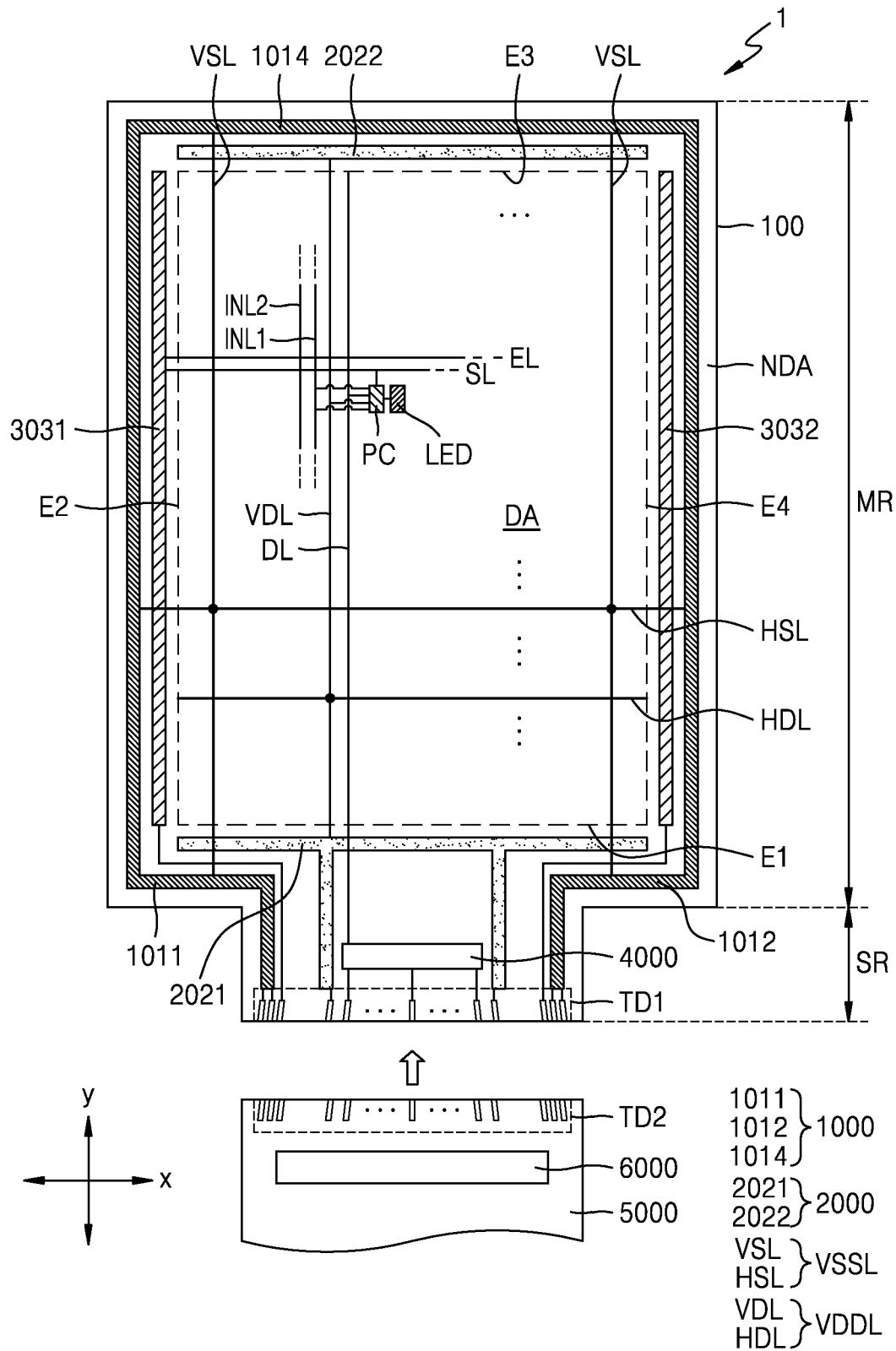
FIG. 1 is a plan view schematically illustrating a display apparatus, according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
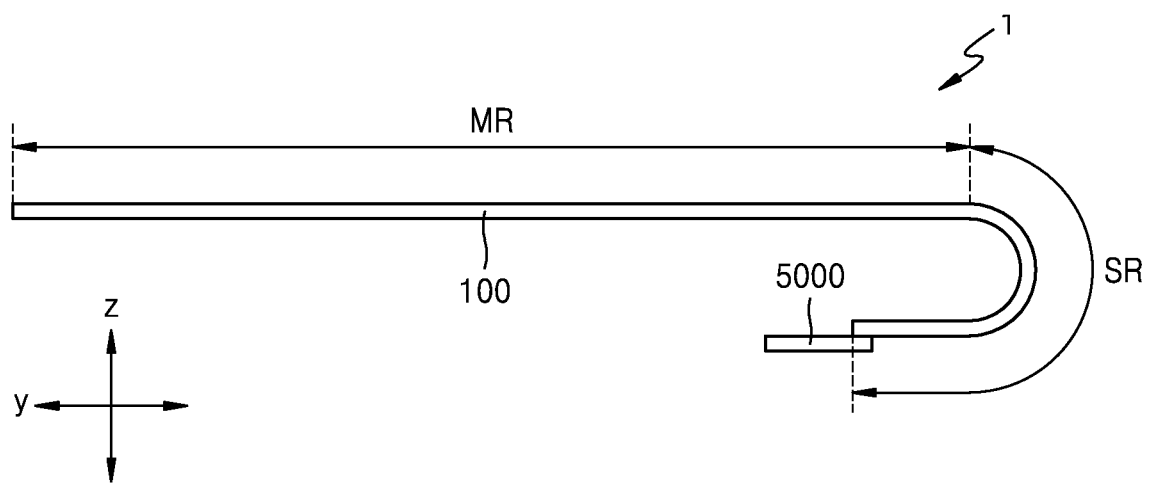
FIG. 2 is a side view schematically illustrating the display apparatus of FIG. 1.

FIG. 1 is a plan view schematically illustrating a display apparatus, according to an embodiment. FIG. 2 is a side view schematically illustrating the display apparatus of FIG. 1.

A display apparatus 1 according to an embodiment is a device for displaying a moving image and/or a still image. Some examples of the display apparatus 1 may include a portable electronic device, such as a mobile phone, a smartphone, a tablet personal (PC) computer, a mobile communication terminal, an electronic organizer, an electronic book, a portable multimedia player (PMP), a navigation device, an ultra-mobile PC (UMPC), and the like, as well as any of various suitable electronic devices, such as a television, a laptop computer, a monitor, an advertisement board, an Internet of things (IoT) product, and the like. Also, the display apparatus 1 according to an embodiment may be used in a wearable device, such as a smart watch, a watch phone, a glasses-type display, a head-mounted display (HMD), and the like. Also, the display apparatus 1 according to an embodiment may be used as a center information display (CID) located on an instrument panel, a center fascia, or a dashboard of a vehicle, a room mirror display replacing a side-view mirror of a vehicle, a display located on the back of a front seat for entertainment for a back seat of a vehicle, and the like. For convenience of illustration, the display apparatus 1 according to an embodiment will be described in more detail in the context of a smartphone.

As used in the specification, "left," "right," "upper," and "lower" directions in a plan view refer to directions when the display apparatus 1 is vertically viewed (e.g., in a +z direction). For example, "left" refers to a −x direction, "right" refers to a +x direction, "upper" refers to a +y direction, and "lower" refers to a −y direction when viewed from a +z direction.

The display apparatus 1 may include a display area DA and a non-display area NDA. The display area DA, which is a portion where an image is displayed, may have a rectangular planar shape having a short side extending in an x direction, and a long side extending in a y direction. A corner where the short side extending in the x direction and the long side extending in the y direction meet each other may be rounded to have a suitable curvature, or may be formed to have a right angle, and thus, the display area DA may have a rectangular or substantially rectangular shape with rounded corners or right-angled corners. In another example, the display area DA may have any of various suitable shapes, such as another polygonal shape, a circular shape, an elliptical shape, or a specific shape.

Light-emitting diodes LEDs may be located at (e.g., in or on) the display area DA. The light-emitting diodes LEDs may be electrically connected to sub-pixel circuits PC, respectively, which may be arranged at (e.g., in or on) the display area DA. The sub-pixel circuit PC may include transistors connected to signal lines and/or voltage lines. In this regard, in FIG. 1, the signal lines that are electrically connected to the transistors include a scan line SL, an emission control line EL, and a data line DL, and the voltage lines include a driving voltage line VDDL, a common voltage line VSSL, a first initialization voltage line INL1, and a second initialization voltage line INL2.

The non-display area NDA may be located outside the display area DA. The non-display area NDA may entirely surround (e.g., around a periphery of) the display area DA. A portion (hereinafter, referred to as a protruding peripheral area) of the non-display area NDA may extend away from the display area DA. In other words, the display apparatus 1 may include a main region MR and a sub-region SR. The main region MR may include the display area DA, and a portion of the non-display area NDA surrounding (e.g., around a periphery of) the display area DA. The sub-region SR may extend in one direction from the main region MR, and may correspond to (e.g., may include) the protruding peripheral area of the non-display area NDA. A width (e.g., in the x direction) of the sub-region SR may be less than a width (e.g., in the x direction) of the main region MR, and a part of the sub-region SR may be bent as shown in FIG. 2.

When the display apparatus 1 is bent as shown in FIG. 2, the non-display area NDA may not be visible, or a visible area of the non-display area NDA may be minimized or reduced when the display apparatus 1 is viewed.

A shape of the display apparatus 1 may be the same or substantially the same as a shape of a substrate 100. For example, the substrate 100 may include the display area DA and the non-display area NDA. As another example, the substrate 100 may include the main region MR and the sub-region SR.

A common voltage supply line 1000, a driving voltage supply line 2000, first and second driving circuits 3031 and 3032, and a data driving circuit 4000 may be located at (e.g., in or on) the non-display area NDA.

The common voltage supply line 1000 may include a first common voltage input unit (e.g., a first common voltage input line) 1011 and a second common voltage input unit (e.g., a second common voltage input line) 1012 located adjacent to a first edge E1 of the display area DA. The first common voltage input unit 1011 and the second common voltage input unit 1012 may be spaced apart from each other. The first common voltage input unit 1011 and the second common voltage input unit 1012 may be located at opposite ends, respectively, of the first edge E1 of the display area DA.

The first common voltage input unit 1011 and the second common voltage input unit 1012 may be connected to each other by a body portion 1014 extending along a second edge E2, a third edge E3, and a fourth edge E4 of the display area DA. In other words, the first common voltage input unit 1011, the second common voltage input unit 1012, and the body portion 1014 may be integrally formed with one another.

The common voltage supply line 1000 may be electrically connected to the common voltage lines VSSL passing through (e.g., extending across) the display area DA. The common voltage lines VSSL located at (e.g., in or on) the display area DA may extend to cross each other. For example, the common voltage lines VSSL may include common voltage lines VSL extending in the y direction, and common voltage lines HSL extending in the x direction. For convenience of description, the "common voltage line extending in the y direction" is referred to as a vertical common voltage line VSL, and the "common voltage line extending in the x direction" is referred to as a horizontal common voltage line HSL.

The vertical common voltage line VSL and the horizontal common voltage line HSL may pass through (e.g., extend across) the display area DA to cross each other. The vertical common voltage line VSL and the horizontal common voltage line HSL may be located at (e.g., in or on) different layers from each other, and may be connected to each other through a contact hole formed in (e.g., penetrating) at least one insulating layer located between the vertical common voltage line VSL and the horizontal common voltage line HSL. The contact hole for connection between the vertical common voltage line VSL and the horizontal common voltage line HSL may be located at (e.g., in or on) the display area DA.

The driving voltage supply line 2000 may include first and second driving voltage input units (e.g., first and second driving voltage lines) 2021 and 2022 that are spaced apart from each other with the display area DA therebetween. The first and second driving voltage input units 2021 and 2022 may extend to be parallel or substantially parallel to each other with the display area DA therebetween. The first driving voltage input unit 2021 may be located adjacent to the first edge E1 of the display area DA, and the second driving voltage input unit 2022 may be located adjacent to the third edge E3 of the display area DA.

The driving voltage supply line 2000 may be electrically connected to the driving voltage lines VDDL passing through (e.g., extending across) the display area DA. The driving voltage lines VDDL located at (e.g., in or on) the display area DA may extend to cross each other. For example, the driving voltage lines VDDL may include driving voltage lines VDL extending in the y direction, and driving voltage lines HDL extending in the x direction. For convenience of description, the "driving voltage line extending in the y direction" is referred to as a vertical driving voltage line VDL, and the "driving voltage line extending in the x direction" is referred to as a horizontal driving voltage line HDL.

The vertical driving voltage line VDL and the horizontal driving voltage line HDL may pass through (e.g., may extend across) the display area DA to cross each other. The vertical driving voltage line VDL and the horizontal driving voltage line HDL may be located at (e.g., in or on) different layers from each other, and may be connected to each other through a contact hole formed in (e.g., penetrating) at least one insulating layer located between the vertical driving voltage line VDL and the horizontal driving voltage line HDL. The contact hole for connection between the vertical driving voltage line VDL and the horizontal driving voltage line HDL may be located at (e.g., in or on) the display area DA.

The first and second driving circuits 3031 and 3032 may be located at (e.g., in or on) the non-display area NDA, and may be electrically connected to the scan line SL and the emission control line EL. In an embodiment, some of the scan lines SL may be electrically connected to the first driving circuit 3031, and the remaining scan lines SL may be electrically connected to the second driving circuit 3032. Each of the first and second driving circuits 3031 and 3032 may include a scan driver for generating a scan signal, and the generated scan signal may be transmitted to a transistor of the sub-pixel circuit PC through a corresponding scan line SL. Each of the first and second driving circuits 3031 and 3032 may include an emission control driver for generating an emission control signal, and the generated emission control signal may be transmitted to a transistor of the sub-pixel circuit PC through a corresponding emission control line EL.

The data driving circuit 4000 may provide a data signal. The data driving circuit 4000 may transmit the data signal to a transistor of the sub-pixel circuit PC through a corresponding data line DL. The data line DL may pass through (e.g., extend across) the display area DA.

A first terminal unit (e.g., a first terminal area) TD1 may be located on a side of the substrate 100. A printed circuit board 5000 may be attached to the first terminal unit TD1. The printed circuit board 5000 may include a second terminal unit (e.g., a second terminal area) TD2 electrically connected to the first terminal unit TD1, and a controller 6000 may be located on the printed circuit board 5000. Control signals of the controller 6000 may be provided to the first and second driving circuits 3031 and 3032, the data driving circuit 4000, the driving voltage supply line 2000, and the common voltage supply line 1000 through the first and second terminal units TD1 and TD2.

Figure 3:
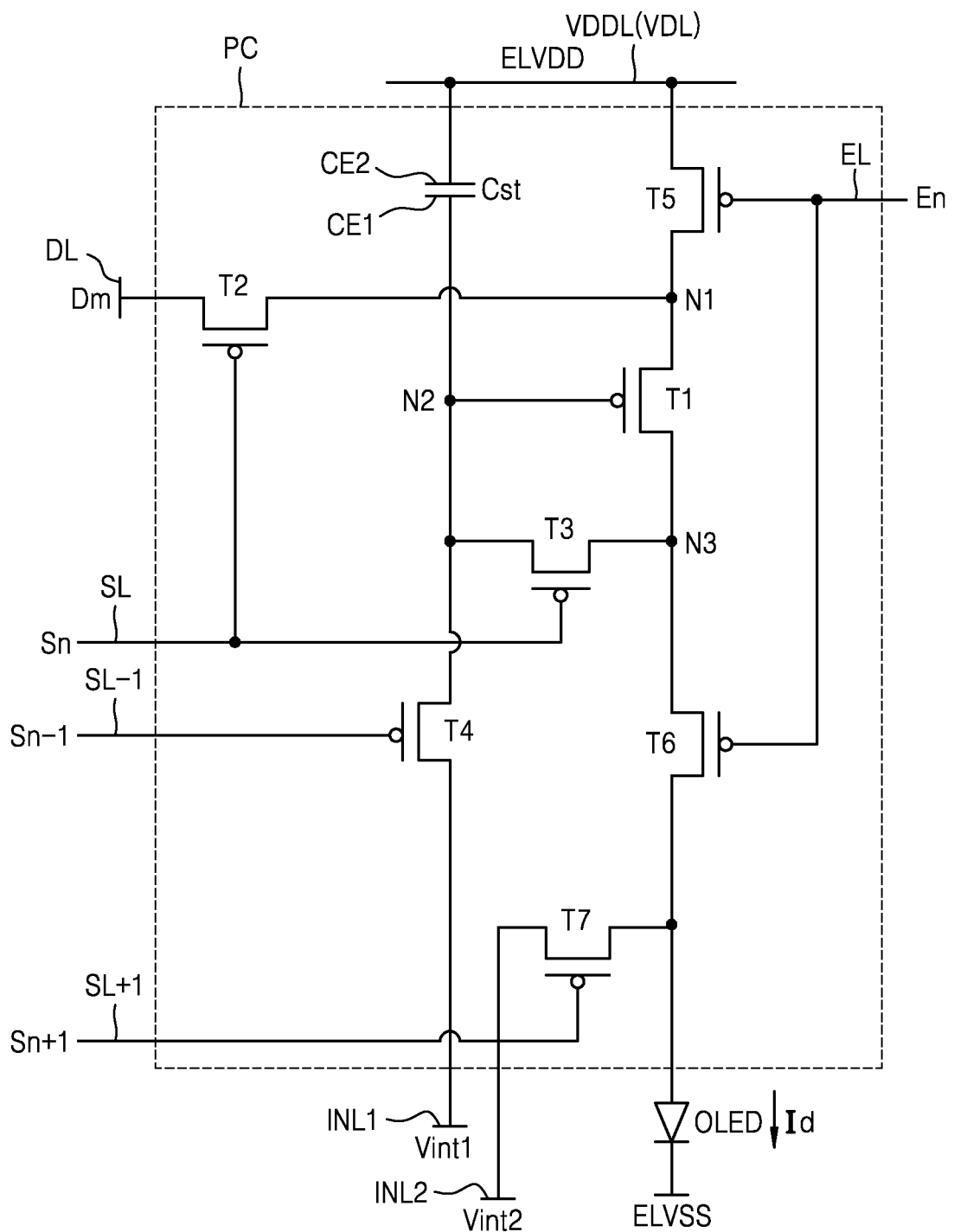
FIG. 3 is an equivalent circuit diagram schematically illustrating a sub-pixel circuit included in a display apparatus, according to an embodiment.

FIG. 3 is an equivalent circuit diagram schematically illustrating a sub-pixel circuit included in a display apparatus, according to an embodiment.

Referring to FIG. 3, a light-emitting diode electrically connected to the sub-pixel circuit PC may be an organic light-emitting diode OLED including an organic emission layer. In some embodiments, the light-emitting diode may be an inorganic light-emitting diode including an inorganic material. The inorganic light-emitting diode may include a PN junction diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers, or several to hundreds of nanometers. For convenience of description, the light-emitting diode will be described in more detail in the context of an organic light-emitting diode OLED.

The sub-pixel circuit PC may include a plurality of thin-film transistors (e.g., T1 through T7) and a storage capacitor Cst, as shown in FIG. 3.

The plurality of thin-film transistors (e.g., T1 through T7) may include a driving transistor T1, a switching transistor T2, a compensation transistor T3, a first initialization transistor T4, an operation control transistor T5, an emission control transistor T6, and a second initialization transistor T7.

The light-emitting diode, for example, the organic light-emitting diode OLED, may include a first electrode (e.g., anode) and a second electrode (e.g., cathode). The first electrode of the organic light-emitting diode OLED may be connected to the driving transistor T1 via the emission control transistor T6, to receive a driving current Id. The second electrode of the organic light-emitting diode OLED may receive a common voltage ELVSS. The organic light-emitting diode OLED may generate light having a desired luminance corresponding to the driving current Id.

In some embodiments, the plurality of thin-film transistors (e.g., T1 through T7) may be p-channel MOSFETs (PMOSs). In another embodiment, some of the plurality of thin-film transistors may be n-channel MOSFETs (NMOSs), and the rest may be PMOSs. For example, the compensation transistor T3 and the first initialization transistor T4 from among the plurality of thin-film transistors (e.g., T1 through T7) may be NMOSs, and the rest may be PMOSs. As another example, the compensation transistor T3 from among the plurality of thin-film transistors (e.g., T1 through T7) may be an NMOS, and the rest may be PMOSs. As another example, all of the plurality of thin-film transistors (e.g., T1 through T7) may be NMOSs.

Each of the plurality of thin-film transistors (e.g., T1 through T7) may include amorphous silicon or polysilicon. When necessary or desired, a thin-film transistor that is an NMOS may include an oxide semiconductor.

The sub-pixel circuit PC may include a plurality of scan lines. The scan lines may include a scan line SL for transmitting a first scan signal Sn, a previous scan line SL−1 for transmitting a previous scan signal Sn−1 to the first initialization transistor T4, and a next scan line SL+1 for transmitting a next scan signal Sn+1 to the second initialization transistor T7.

The sub-pixel circuit PC may include an emission control line EL for transmitting an emission control signal En to the operation control transistor T5 and the emission control transistor T6, and a data line DL for transmitting a data signal Dm.

A driving voltage line VDDL, for example, a vertical driving voltage line VDL, may transmit a driving voltage ELVDD to the driving transistor T1. A first initialization voltage line INL1 may transmit a first initialization voltage Vint1 for initializing the driving transistor T1, and a second initialization voltage line INL2 may transmit a second initialization voltage Vint2 for initializing the first electrode of the organic light-emitting diode OLED.

A driving gate electrode of the driving transistor T1 may be connected to the storage capacitor Cst through a second node N2. Any one of a source region and a drain region of the driving transistor T1 may be connected to the driving voltage line VDDL (e.g., the vertical driving voltage line VDL) via the operation control transistor T5 through a first node N1, and the other one of the source region and the drain region of the driving transistor T1 may be electrically connected to the first electrode (e.g., the anode) of the organic light-emitting diode OLED via the emission control transistor T6 through a third node N3. The driving transistor T1 may receive the data signal Dm according to a switching operation of the switching transistor T2, and may supply the driving current Id to the organic light-emitting diode OLED. In other words, the driving transistor T1 may control an amount of current flowing from the first node N1 electrically connected to the driving voltage line VDDL (e.g., the vertical driving voltage line VDL) to the organic light-emitting diode OLED in response to a voltage applied to the second node N2 that varies according to the data signal Dm.

A switching gate electrode of the switching transistor T2 may be connected to the scan line SL that transmits the first scan signal Sn. Any one of a source region and a drain region of the switching transistor T2 may be connected to the data line DL. The other one of the source region and the drain region of the switching transistor T2 may be connected to the driving transistor T1 through the first node N1, and may be connected to the driving voltage line VDDL (e.g., the vertical driving voltage line VDL) via the operation control transistor T5. The switching transistor T2 may transmit the data signal Dm from the data line DL to the first node N1, in response to a voltage applied to the scan line SL. In other words, the switching transistor T2 may be turned on according to the first scan signal Sn received through the scan line SL, and may perform a switching operation of transmitting the data signal Dm received through the data line DL to the driving transistor T1 through the first node N1.

A compensation gate electrode of the compensation transistor T3 is connected to the scan line SL. Any one of a source region and a drain region of the compensation transistor T3 may be connected to the first electrode of the organic light-emitting diode OLED via the emission control transistor T6 through the third node N3. The other one of the source region and the drain region of the compensation transistor T3 may be connected to a first capacitor electrode CE1 of the storage capacitor Cst and the driving gate electrode of the driving transistor T1 through the second node N2. The compensation transistor T3 may be turned on according to the scan signal Sn received through the scan line SL, and may diode-connect the driving transistor T1.

A first initialization gate electrode of the first initialization transistor T4 may be connected to the previous scan line SL−1. Any one of a source region and a drain region of the first initialization transistor T4 may be connected to the first initialization voltage line INL1. The other one of the source region and the drain region of the first initialization transistor T4 may be connected to the driving gate electrode of the driving transistor T1 and the first capacitor electrode CE1 of the storage capacitor Cst through the second node N2. The first initialization transistor T4 may apply the first initialization voltage Vint1 from the first initialization voltage line INL1 to the second node N2, in response to a voltage applied to the previous scan line SL−1. In other words, the first initialization transistor T4 may be turned on according to the previous scan signal Sn−1 received through the previous scan line SL−1, and may perform an initialization process of initializing a voltage of the driving gate electrode of the driving transistor T1 by transmitting the first initialization voltage Vint1 to the driving gate electrode of the driving transistor T1.

An operation control gate electrode of the operation control transistor T5 may be connected to the emission control line EL. Any one of a source region and a drain region of the operation control transistor T5 may be connected to the driving voltage line VDDL (e.g., the vertical driving voltage line VDL), and the other one of the source region and the drain region of the operation control transistor T5 may be connected to the driving transistor T1 and the switching transistor T2 through the first node N1.

An emission control gate electrode of the emission control transistor T6 may be connected to the emission control line EL. Any one of a source region and a drain region of the emission control transistor T6 may be connected to the driving transistor T1 and the compensation transistor T3 through the third node N3, and the other one of the source region and the drain region of the emission control transistor T6 may be electrically connected to the first electrode (e.g., the anode) of the organic light-emitting diode OLED.

The operation control transistor T5 and the emission control transistor T6 may be concurrently (e.g., simultaneously) turned on according to the emission control signal En received through the emission control line EL, so that the driving voltage ELVDD is transmitted to the organic light-emitting diode OLED, and the driving current Id flows through the organic light-emitting diode OLED.

A second initialization gate electrode of the second initialization transistor T7 may be connected to the next scan line SL+1. Any one of a source region and a drain region of the second initialization transistor T7 may be connected to the first electrode (e.g., the anode) of the organic light-emitting diode OLED, and the other one of the source region and the drain region of the second initialization transistor T7 may be connected to the second initialization voltage line INL2 to receive the second initialization voltage Vint2. The second initialization transistor T7 is turned on according to the next scan signal Sn+1 received through the next scan line SL+1, and initializes the first electrode (e.g., the anode) of the organic light-emitting diode OLED. The next scan line SL+1 may be the same or substantially the same as the scan line SL included in a sub-pixel circuit located in an adjacent row. In this case, the scan line may function as the scan line SL or may function as the next scan line SL+1, by transmitting the same or substantially the same electrical signal with a time difference. In other words, the next scan line SL+1 may be a scan line of another sub-pixel circuit adjacent to the sub-pixel circuit PC of FIG. 3 and electrically connected to the same data line DL as that of the sub-pixel circuit PC of FIG. 3.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line VDDL (e.g., the vertical driving voltage line VDL). The storage capacitor Cst may store a charge corresponding to a difference between the driving voltage ELVDD and a driving gate electrode voltage of the driving transistor T1.

Figure 4:
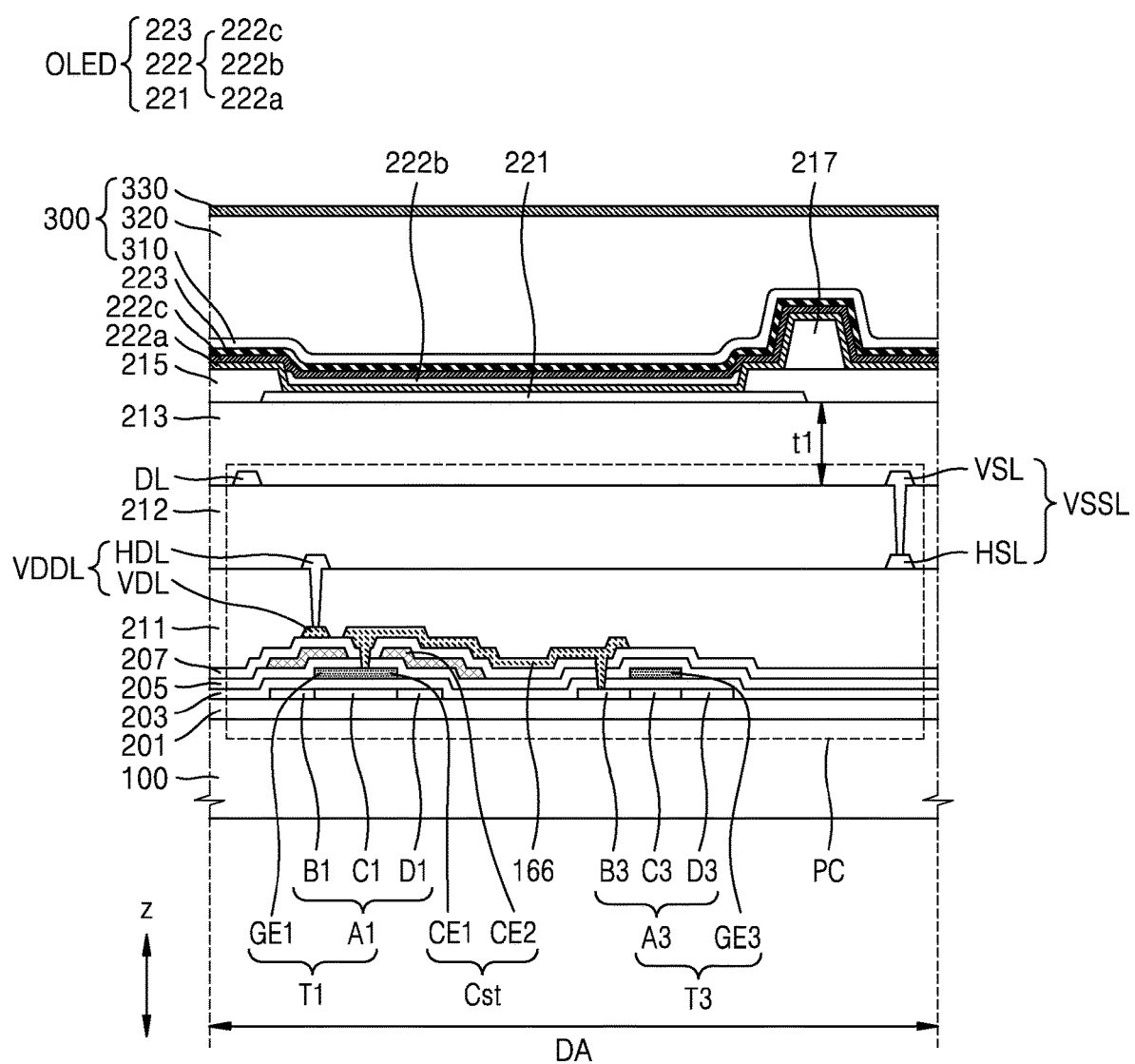
FIG. 4 is a cross-sectional view schematically illustrating a display area of a display apparatus, according to an embodiment.

FIG. 4 is a cross-sectional view schematically illustrating a display area of a display apparatus, according to an embodiment.

Referring to FIG. 4, the organic light-emitting diode OLED may be located at (e.g., in or on) the display area DA. The organic light-emitting diode OLED may be electrically connected to the sub-pixel circuit PC. The sub-pixel circuit PC may be located between the substrate 100 and the organic light-emitting diode OLED in a thickness direction (e.g., the z direction), which is perpendicular to or substantially perpendicular to the substrate 100.

The substrate 100 may include a glass material or a polymer resin. In an embodiment, the substrate 100 may have a structure in which a base layer including a polymer resin and a barrier layer including an inorganic insulating material, such as silicon oxide or silicon nitride, are alternately stacked. Examples of the polymer resin may include polyethersulfone, polyarylate, polyether imide, polyethylene naphthalate, polyethylene terephthalate, polyphenylene sulfide, polyimide, polycarbonate, cellulose triacetate, and cellulose acetate propionate.

Before the sub-pixel circuit PC is formed, a buffer layer 201 may be formed on the substrate 100 to prevent or substantially prevent impurities from penetrating into the sub-pixel circuit PC. The buffer layer 201 may include an inorganic insulating material, such as silicon nitride, silicon oxynitride, or silicon oxide, and may have a single-layer structure or a multi-layered structure including one or more of the above inorganic insulating materials.

The sub-pixel circuit PC may include a plurality of transistors and a storage capacitor, for example, such as those described above with reference to FIG. 3. In this regard, FIG. 4 illustrates the driving transistor T1, the compensation transistor T3, and the storage capacitor Cst.

The driving transistor T1 may include a semiconductor layer (hereinafter, referred to as a driving semiconductor layer A1) on the buffer layer 201, and a driving gate electrode GE1 overlapping with a channel region C1 of the driving semiconductor layer A1. The driving semiconductor layer A1 may include a silicon-based semiconductor material, for example, such as polysilicon. The driving semiconductor layer A1 may include the channel region C1, and a first region B1 and a second region D1 located at (e.g., in or on) opposite sides of the channel region C1. The first region B1 and the second region D1 are regions having a higher impurity concentration than that of the channel region C1. One of the first region B1 and the second region D1 may correspond to a source region, and the other of the first region B1 and the second region D1 may correspond to a drain region.

The compensation transistor T3 may include a semiconductor layer (hereinafter, referred to as a compensation semiconductor layer A3) on the buffer layer 201, and a compensation gate electrode GE3 overlapping with a channel region C3 of the compensation semiconductor layer A3. The compensation semiconductor layer A3 may include the channel region C3, and a first region B3 and a second region D3 located at (e.g., in or on) opposite sides of the channel region C3. The first region B3 and the second region D3 are regions having a higher impurity concentration than that of the channel region C3. One of the first region B1 and the second region D1 may correspond to a source region, and the other of the first region B1 and the second region D1 may correspond to a drain region.

Each of the driving gate electrode GE1 and the compensation gate electrode GE3 may include a conductive material including molybdenum (Mo), aluminum (Al), copper (Cu), or titanium (Ti), and may have a single-layer structure or multi-layered structure including one or more of the above conductive materials.

A gate insulating layer 203 may be located between the driving semiconductor layer A1 and the driving gate electrode GE1, and between the compensation semiconductor layer A3 and the compensation gate electrode GE3. The gate insulating layer 203 may include an inorganic insulating material, such as silicon nitride, silicon oxynitride, or silicon oxide, and may have a single-layer structure or a multi-layered structure including one or more of the above inorganic insulating materials.

The storage capacitor Cst may include the first capacitor electrode CE1 and the second capacitor electrode CE2 overlapping with each other. In an embodiment, the first capacitor electrode CE1 of the storage capacitor Cst may include the driving gate electrode GE1. In other words, the driving gate electrode GE1 may correspond to (e.g., may be or may include) the first capacitor electrode CE1 of the storage capacitor Cst. For example, the driving gate electrode GE1 and the first capacitor electrode CE1 of the storage capacitor Cst may be integrally formed with each other.

A first interlayer insulating layer 205 may be located between the first capacitor electrode CE1 and the second capacitor electrode CE2 of the storage capacitor Cst. The first interlayer insulating layer 205 may include an inorganic insulating material, such as silicon oxide, silicon nitride, or silicon oxynitride, and may have a single-layer structure or a multi-layered structure including one or more of the above inorganic insulating materials.

The second capacitor electrode CE2 of the storage capacitor Cst may include a low-resistance conductive material, such as molybdenum (Mo), aluminum (Al), copper (Cu), and/or titanium (Ti), and may have a single-layer structure or a multi-layered structure including one or more of the above low-resistance conductive materials.

A second interlayer insulating layer 207 may be located on the storage capacitor Cst. The second interlayer insulating layer 207 may include an inorganic insulating material, such as silicon oxide, silicon nitride, or silicon oxynitride, and may have a single-layer structure or a multi-layered structure including one or more of the above inorganic insulating materials.

The driving transistor T1 and the compensation transistor T3 may be electrically connected to each other through a node connection line 166. The node connection line 166 may be located on the second interlayer insulating layer 207. A side of the node connection line 166 may be connected to the driving gate electrode GE1 of the driving transistor T1, and another side of the node connection line 166 may be connected to the compensation semiconductor layer A3 of the compensation transistor T3.

The node connection line 166 may include aluminum (Al), copper (Cu), and/or titanium (Ti), and may have a single-layer structure or a multi-layered structure including one or more of the above materials. For example, the node connection line 166 may have a three-layered structure including a titanium layer, an aluminum layer, and a titanium layer.

A first organic insulating layer 211 may be located on the node connection line 166. The first organic insulating layer 211 may include an organic insulating material. The organic insulating material may include acryl, benzocyclobutene (BCB), polyimide, or hexamethyldisiloxane (HMDSO).

The driving voltage line VDDL may include the vertical driving voltage line VDL and the horizontal driving voltage line HDL located at (e.g., in or on) different layers from each other. The first organic insulating layer 211 may be located between the vertical driving voltage line VDL and the horizontal driving voltage line HDL. For example, the vertical driving voltage line VDL may be located under (e.g., underneath) the first organic insulating layer 211, and the horizontal driving voltage line HDL may be located over the first organic insulating layer 211. A part of the horizontal driving voltage line HDL may be connected to a part of the vertical horizontal voltage line VDL through a contact hole of the first organic insulating layer 211.

When the driving voltage line VDDL includes the vertical driving voltage line VDL and the horizontal driving voltage line HDL, a voltage drop due to a resistance of the driving voltage line VDL itself may be prevented or substantially prevented.

Each of the vertical driving voltage line VDL and the horizontal driving voltage line HDL may include aluminum (Al), copper (Cu), and/or titanium (Ti), and may have a single-layer structure or a multi-layered structure including one or more of the above materials. For example, each of the vertical driving voltage line VDL and the horizontal driving voltage line HDL may have a three-layered structure including a titanium layer, an aluminum layer, and a titanium layer.

The common voltage line VSSL may include the vertical common voltage line VSL and the horizontal common voltage line HSL located at (e.g., in or on) different layers from each other. A second organic insulating layer 212 may be located between the vertical common voltage line VSL and the horizontal common voltage line HSL. For example, the vertical common voltage line VSL may be located over the second organic insulating layer 212, and the horizontal common voltage line HSL may be located under (e.g., underneath) the second organic insulating layer 212. A part of the vertical common voltage line VSL may be connected to a part of the horizontal common voltage line HSL through a contact hole of the second organic insulating layer 212.

Each of the vertical common voltage line VSL and the horizontal common voltage line HSL may include aluminum (Al), copper (Cu), and/or titanium (Ti), and may have a single-layer structure or a multi-layered structure including one or more the above materials. For example, each of the vertical common voltage line VSL and the horizontal common voltage line HSL may have a three-layered structure including a titanium layer, an aluminum layer, and a titanium layer.

The data line DL may be located on the second organic insulating layer 212. The data line DL and the vertical common voltage line VSL may be located at (e.g., in or on) the same layer as each other, and may include the same material as each other. The data line DL may include aluminum (Al), copper (Cu), and/or titanium (Ti), and may have a single-layer structure or a multi-layered structure including one or more of the above materials. For example, the data line DL may have a three-layered structure including a titanium layer, an aluminum layer, and a titanium layer.

A third organic insulating layer 213 may be located on the data line DL. The third organic insulating layer 213 may include an organic insulating material, such as acryl, BCB, polyimide, and/or HMDSO.

The light-emitting diode, for example, the organic light-emitting diode OLED, may be located on the third organic insulating layer 213. A first electrode 221 of the organic light-emitting diode OLED may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another example, the first electrode 221 may further include a conductive oxide layer over and/or under the reflective film. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first electrode 221 may have a three-layered structure including ITO/Ag/ITO.

A bank layer 215 may be located on the first electrode 221. The bank layer 215 may have an opening overlapping with the first electrode 221, and may cover an edge of the first electrode 221. The bank layer 215 may include an organic insulating material.

An intermediate layer 222 includes an emission layer 222b. The intermediate layer 222 may include a first functional layer 222a located under (e.g., underneath) the emission layer 222b and/or a second functional layer 222c located over the emission layer 222b. The emission layer 222b may include a high molecular weight organic material or a low molecular weight organic material for emitting light of a certain color. The second functional layer 222c may include an electron transport layer (ETL) and/or an electron injection layer (EIL). Each of the first functional layer 222a and the second functional layer 222c may include an organic material.

A second electrode 223 may be formed of a conductive material having a low work function. For example, the second electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, the second electrode 223 may further include a layer formed of ITO, IZO, ZnO, or $In_2O_3$ on the (semi)transparent layer including one or more of the above materials.

The emission layer 222b may be formed at (e.g., in or on) the display area DA to overlap with the first electrode 221 through the opening of the bank layer 215. On the other hand, the first functional layer 222a, the second functional layer 222c, and the second electrode 223 may cover an entirety of the display area DA.

A spacer 217 may be formed on the bank layer 215. The spacer 217 and the bank layer 215 may be formed together in the same or substantially the same process, or may be individually formed in separate processes from each other. In an embodiment, the spacer 217 may include an organic insulating material, such as polyimide.

The organic light-emitting diode OLED may be covered by an encapsulation layer 300. The encapsulation layer 300 may include at least one organic encapsulation layer, and at least one inorganic encapsulation layer. In an embodiment, as shown in FIG. 4, the encapsulation layer 300 includes first and second inorganic encapsulation layers 310 and 330, and an organic encapsulation layer 320 located between the first and second inorganic encapsulation layers 310 and 330.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may have a single-layer structure or a multi-layered structure including one or more of the above inorganic materials. The organic encapsulation layer 320 may include a polymer-based material. Examples of the polymer-based material may include an acrylic resin, an epoxy resin, polyimide, and/or polyethylene. In an embodiment, the organic encapsulation layer 320 may include acrylate.

Figure 5A:
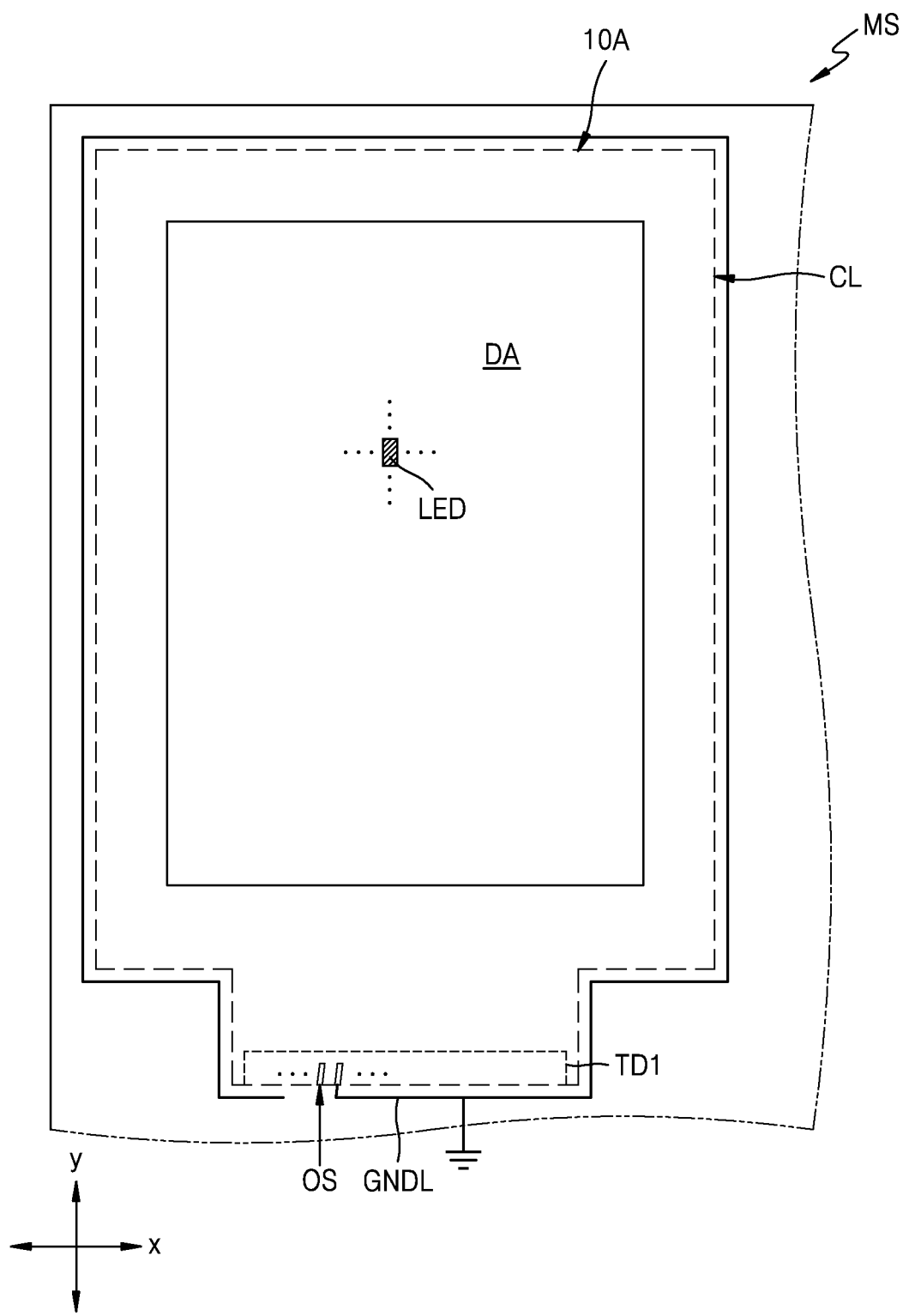
FIGS. 5A-5C are plan views schematically illustrating various processes of manufacturing a display apparatus, according to an embodiment.
Figure 5B:
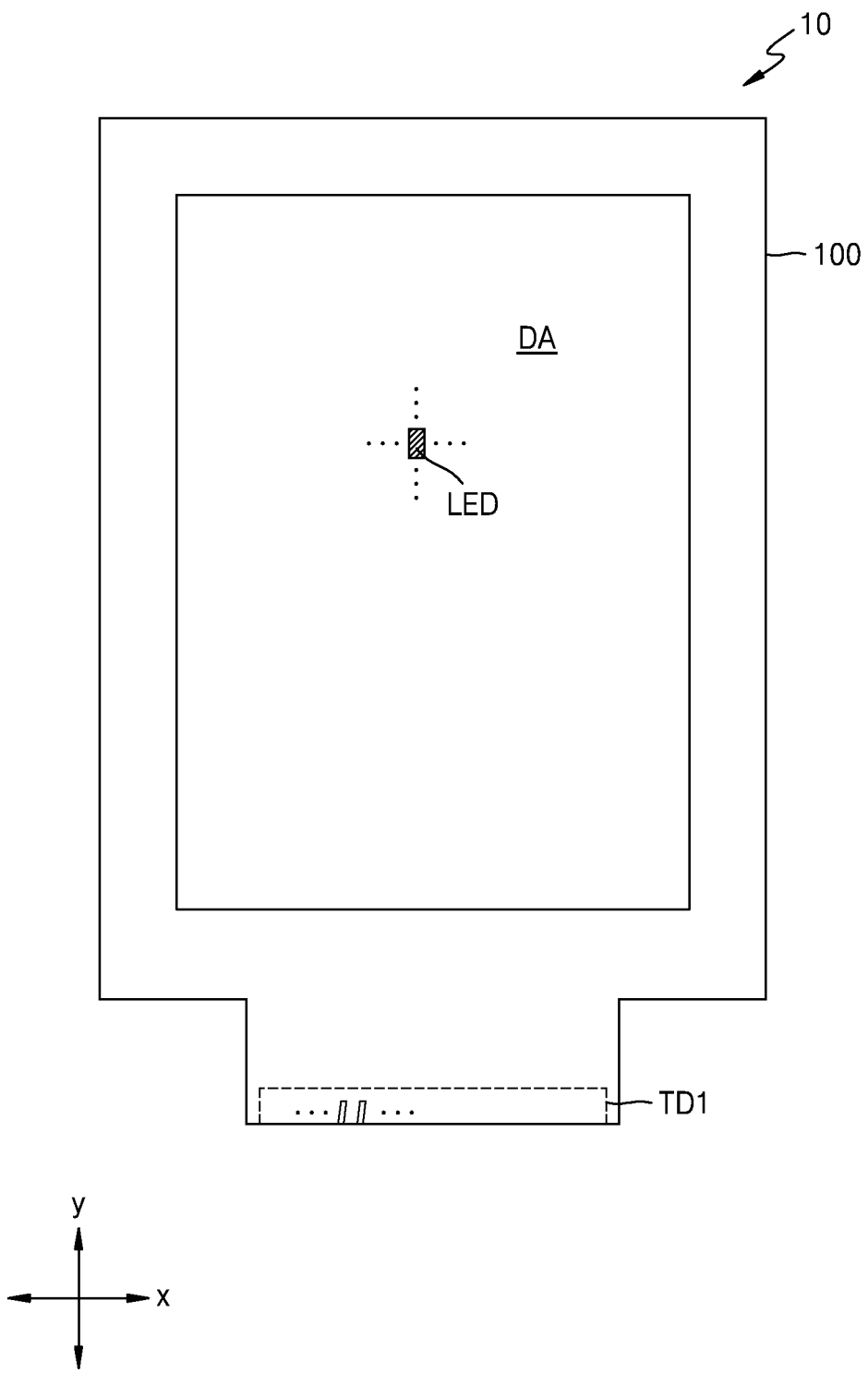
Figure 5C:
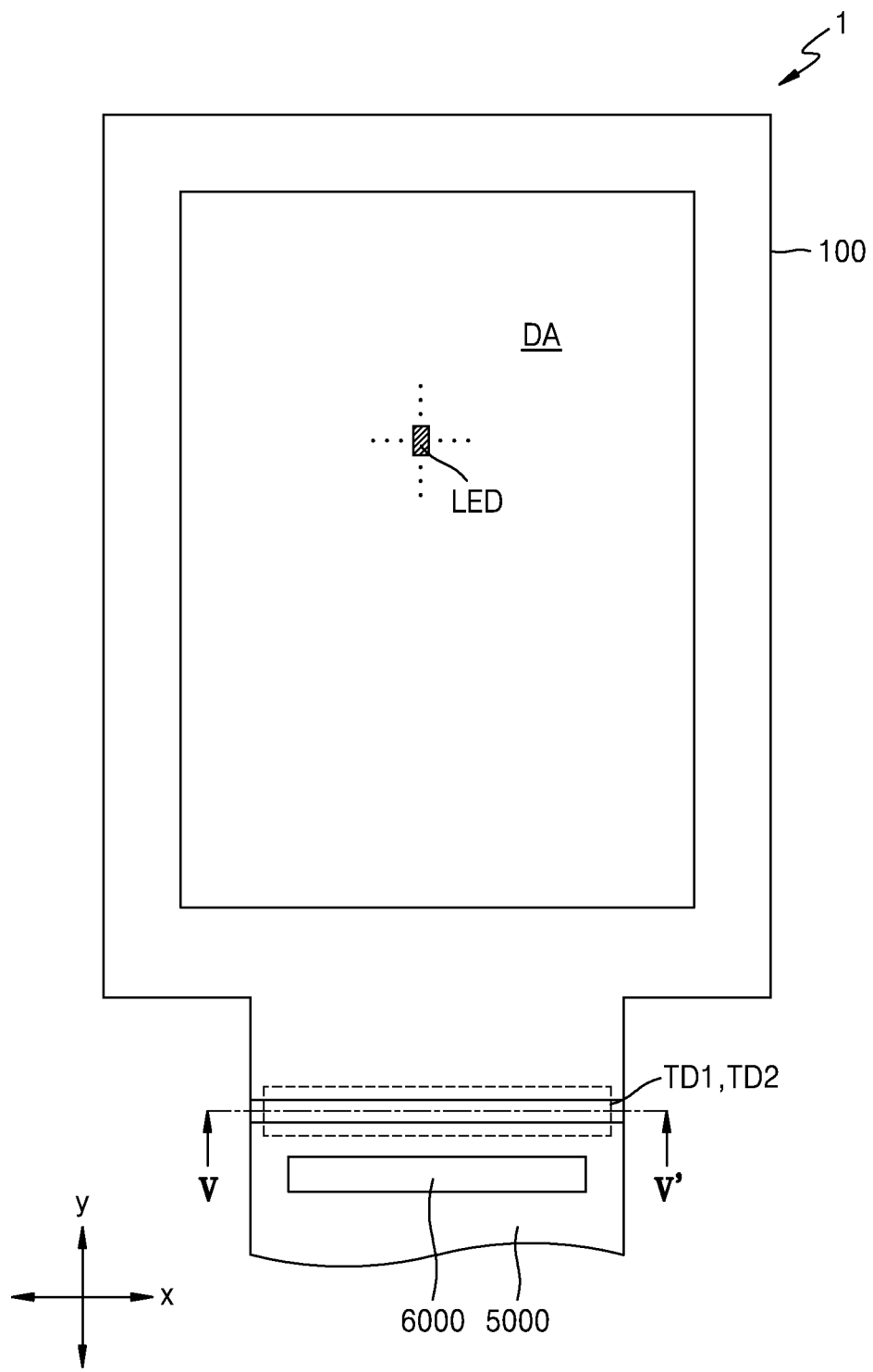
Figure 5D:
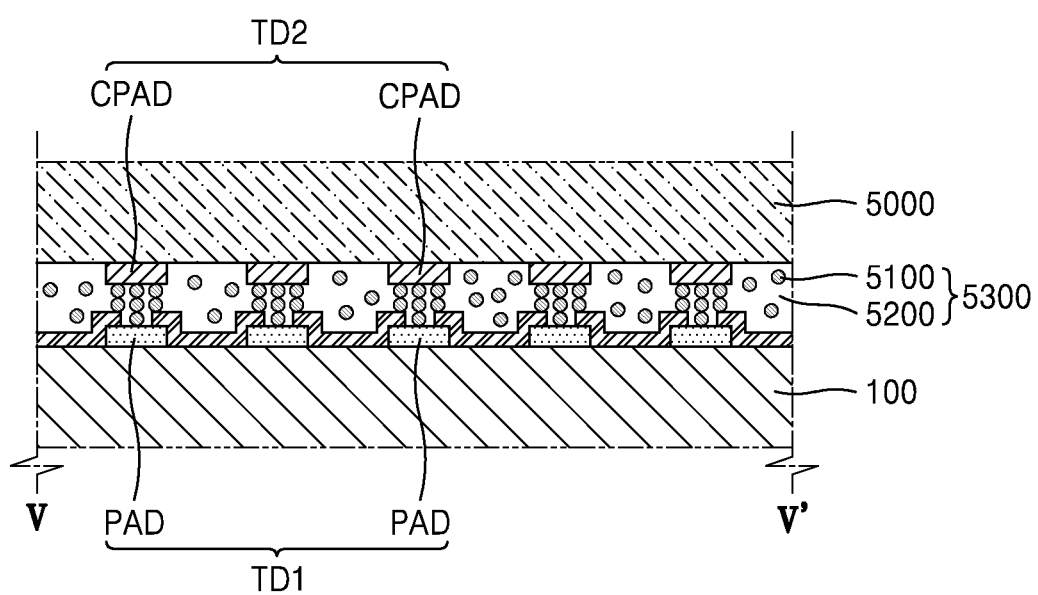
FIG. 5D is a cross-sectional view taken along the line V-V' of FIG. 5C.

FIGS. 5A through 5C are plan views schematically illustrating various processes of manufacturing a display apparatus, according to an embodiment. FIG. 5D is a cross-sectional view taken along the line V-V' of FIG. 5C.

Referring to FIG. 5A, an element corresponding to a preliminary display panel 10A is formed on a motherboard MS. In this regard, FIG. 5A illustrates light-emitting diodes LEDs formed at (e.g., in or on) the display area DA, and the first terminal unit TD1 located outside the display area DA. All elements on the substrate 100 (e.g., see FIG. 1) may be formed on the motherboard MS. Although one preliminary display panel 10A formed on the motherboard MS is illustrated in FIG. 5A, a plurality of preliminary display panels 10A may be formed on the motherboard MS.

Next, when the motherboard MS is cut along a cutting line CL, the display panel 10 may be formed as shown in FIG. 5B. Cutting may be performed by using, for example, a laser. By attaching the printed circuit board 5000 to the first terminal unit TD1 of the display panel 10 of FIG. 5B, the display apparatus 1 may be formed as shown in FIG. 5C.

Before the cutting process along the cutting line CL, various inspections may be performed on the preliminary display panel 10A (e.g., see FIG. 5A). In an embodiment, lighting inspection may be performed on the preliminary display panel 10A. An inspection signal OS for the lighting inspection may be applied to at least one of a plurality of pads provided at (e.g., in or on) the first terminal unit TD1. Other pads, which are different from the pad used in the lighting inspection, may be connected to a ground line GNDL. The ground line GNDL may at least partially surround (e.g., around a periphery of) an outer side of the cutting line CL.

At least one of the pads of the first terminal unit TD1 may be used for the lighting inspection as shown in FIG. 5A, and after the cutting process, as shown in FIG. 5C, the pad may be electrically connected to the second terminal unit TD2 of the printed circuit board 5000 to receive a control signal of the controller 6000.

Referring to FIG. 5D, pads PAD on the substrate 100 face counter pads CPAD of the printed circuit board 5000. A conductive adhesive member 5300 may be located between the first terminal unit TD1 and the second terminal unit TD2. The conductive adhesive member 5300 may include an adhesive resin 5200, and conductive balls 5100 dispersed in the adhesive resin 5200. A thermo-compression process may be performed in a state where the conductive adhesive member 5300 is located between the pad PAD and the counter pad CPAD, and the second terminal unit TD2 may be attached to the first terminal unit TD1 through the thermo-compression process. In order to check a quality of the adhesion, a method of checking an indentation of the conductive balls 5100 between the pad PAD and the counter pad CPAD may be used. The method of checking the indentation may use light emitted from a rear surface of the substrate 100.

Figure 6:
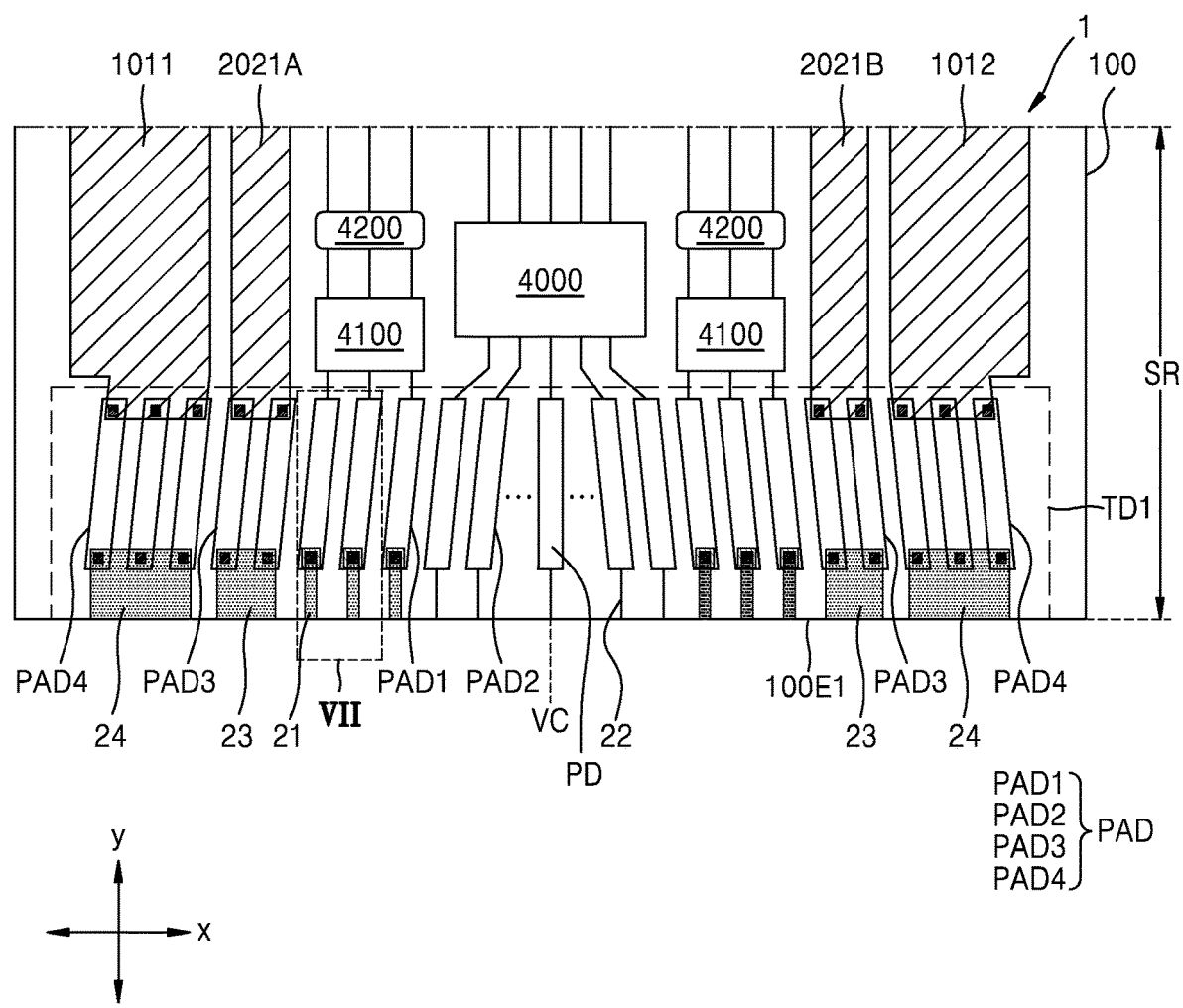
FIG. 6 is a plan view illustrating a portion of a display apparatus, according to an embodiment.

FIG. 6 is a plan view illustrating a portion of a display apparatus, according to an embodiment. FIG. 6 illustrates a portion of the display apparatus 1 corresponding to the sub-region SR of the display apparatus 1 described above with reference to FIG. 1.

Referring to FIG. 6, the pads PAD are located at (e.g., in or on) the first terminal unit TD1 located on a side of the substrate 100. The pads PAD may be symmetrical or substantially symmetrical relative to a pad PD that is located at the center of the first terminal unit TD1. For example, the pads PAD located at (e.g., in or on) opposite sides of a virtual line VC passing through the center of the substrate 100 may extend obliquely with respect to the y direction. In this regard, in FIG. 6, each of the pads PAD located at (e.g., in or on) opposite sides of the virtual line VC has a parallelogram or substantially parallelogram shape in a plan view. In this case, the pad PAD may occupy a relatively small space on the substrate 100, while a length of the pad PAD may be increased.

Some pads (e.g., pads located between an outer portion and the virtual line VC passing through the center of the substrate 100, hereinafter, referred to as a first pad) PAD1 from among the pads PAD may be electrically connected to a first outer circuit 4100 and a second outer circuit 4200. The first outer circuit 4100 may include an electrostatic protection circuit, and the second outer circuit 4200 may include an inspection circuit for performing the lighting inspection and/or an inspection of a data line.

Some pads (e.g., pads located at (e.g., in or on) a central portion, hereinafter, referred to as a second pad) PAD2 from among the pads PAD may be electrically connected to the data driving circuit 4000. Some pads (e.g., pads located outside the first pad PAD1, hereinafter, referred to as a third pad) PAD3 from among the pads PAD may be electrically connected to extension lines 2021A and 2021B extending from the first driving voltage input unit 2021 (e.g., see FIG. 1). Some pads (e.g., pads located at (e.g., in or on) an outer portion, hereinafter, referred to as a fourth pad) PAD4 from among the pads PAD may be electrically connected to a corresponding one of the first common voltage input unit 1011 and the second common voltage input unit 1012 of the common voltage supply line 1000 (e.g., see FIG. 1). Further, some of the pads PAD may be electrically connected to the first and second driving circuits 3031 and 3032 described above with reference to FIG. 1.

Each pad PAD may be electrically connected to a conductive line extending toward a first edge 100E1 of the substrate 100. For example, the first pad PAD1 may be electrically connected to a first conductive line 21 extending toward the first edge 100E1 of the substrate 100, and the second pad PAD2 may be electrically connected to a second conductive line 22 extending toward the first edge 100E1 of the substrate 100.

The first conductive line 21 electrically connected to the first pad PAD1 may be a part of a wiring to which the lighting inspection signal OS described above with reference to FIG. 5A is applied. The second conductive line 22 electrically connected to the second pad PAD2 may be a part of a wiring electrically connected to the ground line GNDL described above with reference to FIG. 5A. The first conductive line 21 and the second conductive line 22 may include different materials from each other. For example, the first conductive line 21 may include a metal, and the second conductive line 22 may include a semiconductor material (e.g., a semiconductor material doped with impurities).

The third pad PAD3 and the fourth pad PAD4 may be electrically connected to a third conductive line 23 and a fourth conductive line 24, respectively. Each of the third conductive line 23 and the fourth conductive line 24 may extend toward the first edge 100E1 of the substrate 100, and may include a conductive material, such as a metal.

Figure 7:
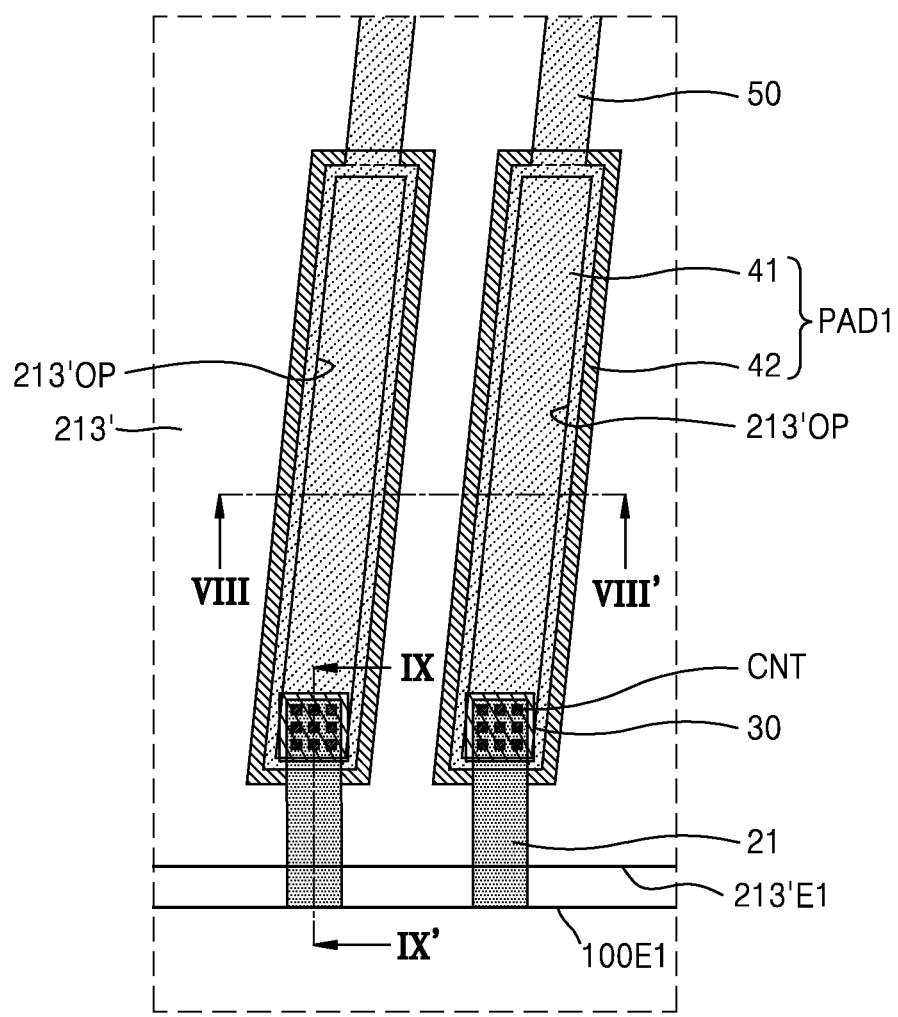
FIG. 7 is an enlarged plan view illustrating the portion VII of FIG. 6.

FIG. 7 is an enlarged plan view illustrating the portion VII of FIG. 6. Although a structure of the first pad PAD1 described above with reference to FIG. 6 is illustrated in more detail in FIG. 7, the other pads PAD described above with reference to FIG. 6, for example, such as the second through fourth pads PAD2, PAD3, and PAD4, may have the same or substantially the same structure as that of the first pad PAD1 shown in FIG. 7, and thus, redundant description thereof may not be repeated.

Referring to FIG. 7, the first pad PAD1 may have a parallelogram shape in a plan view. The first pad PAD1 may include a plurality of layers. For example, the first pad PAD1 may include a first pad layer 41, and a second pad layer 42 overlapping with the first pad layer 41. The first pad layer 41 may be electrically connected to a wiring 50 located on the first pad PAD1 shown in FIG. 7. The wiring 50 may extend away from the first edge 100E1 of the substrate 100. The wiring 50 may be electrically connected to the first outer circuit 4100 described above with reference to FIG. 6.

In some embodiments, the wiring 50 and the first pad layer 41 may be integrally formed with each other. In other words, the first pad layer 41 and the wiring 50 may be formed at (e.g., in or on) the same layer as each other, and may include the same material as each other. The second pad layer 421 may overlap with the first pad layer 41 to entirely cover the first pad layer 41. The second pad layer 42 may have an isolated shape (e.g., an island shape or a shape like an island) in a plan view.

The first conductive line 21 may be located at an opposite end from that of the wiring 50 with the first pad PAD1 therebetween. The first conductive line 21 may extend toward the first edge 100E1 of the substrate 100, and an edge of the first conductive line 21 and the first edge 100E1 of the substrate 100 may be aligned or substantially aligned with each other.

The first conductive line 21 and the first pad PAD1 may be electrically connected to each other via a conductor 30. The conductor 30 may have an isolated shape in a plan view. The conductor 30 may entirely overlap with the first pad PAD1. In other words, an entire top surface of the conductor 30 may be covered by the first pad PAD1. For example, the entire top surface of the conductor 30 may be covered by the first pad layer 41 and the second pad layer 42. The first pad layer 41 may extend past edges of the conductor 30, and thus, the conductor 30 may be covered by the first pad layer 41 having a larger area than that of the conductor 30. Likewise, the second pad layer 42 may have a larger area than that of the conductor 30. The second pad layer 42 may extend in a vertical direction (e.g., an up-down direction) and a horizontal direction (e.g., a left-right direction) past the edges of the conductor 30.

An insulating layer 213' may be located on the first pad PAD1, and may have an opening 213'OP through which a portion of the first pad PAD1 is exposed. The portion of the first pad PAD1 exposed through the opening 213'OP of the insulating layer 213' may be electrically connected to a pad of the second terminal unit TD2 of the printed circuit board 5000, as described above with reference to FIGS. 5C and 5D.

Figure 8:
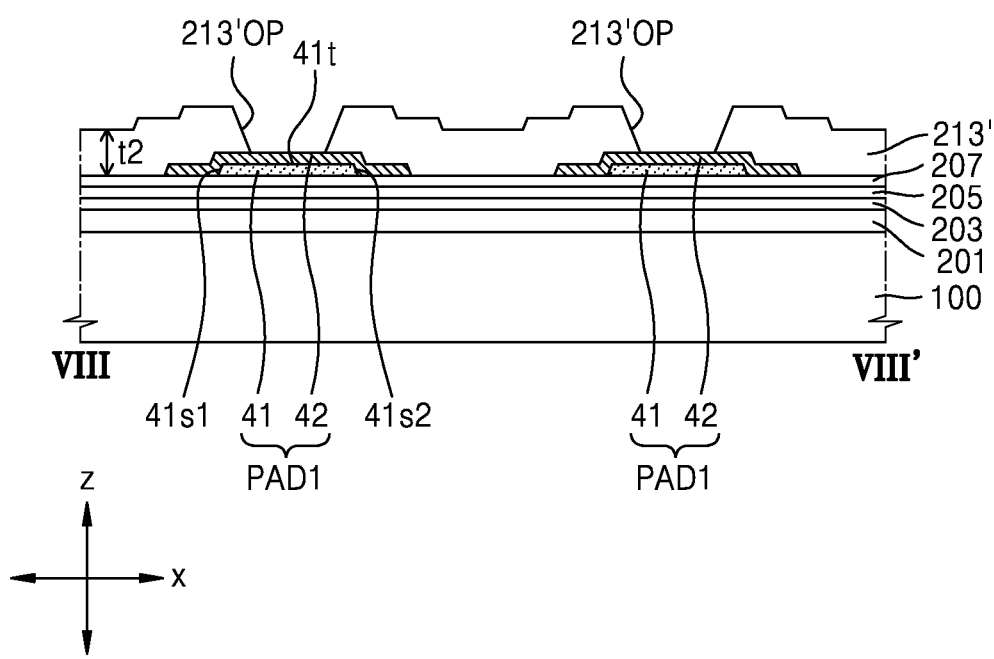
FIG. 8 is a cross-sectional view taken along the line VIII-VIII' of FIG. 7.

FIG. 8 is a cross-sectional view taken along the line VIII-VIII' of FIG. 7.

Referring to FIGS. 7 and 8, the first pads PAD1 may be located on the substrate 100 to be spaced apart from one another. At least one inorganic insulating layer, for example, such as the buffer layer 201, the gate insulating layer 203, the first interlayer insulating layer 205, and the second interlayer insulating layer 207, may be formed on the substrate 100. The first pad PAD1 may be formed on the second interlayer insulating layer 207.

The first pad layer 41 of the first pad PAD1 may be formed on the second interlayer insulating layer 207, and the second pad layer 42 may be located on the first pad layer 41.

The first pad layer 41 may include a metal, such as aluminum (Al), copper (Cu), and/or titanium (Ti), and may have a single-layer structure or a multi-layered structure including one or more of the above metal materials. The first pad layer 41 may be formed in the same or substantially the same process as that of the horizontal driving voltage line HDL and/or the horizontal common voltage line HSL described above with reference to FIG. 4. The first pad layer 41, and the horizontal driving voltage line HDL and/or the horizontal common voltage line HSL described above with reference to FIG. 4 may be located at (e.g., in or on) the same layer as each other, and may include the same material as each other. For example, the first pad layer 41, the horizontal driving voltage line HDL, and the horizontal common voltage line HSL may include the same metal element as each other. In some embodiments, each of the first pad layer 41, the horizontal driving voltage line HDL, and the horizontal common voltage line HSL may have a three-layered structure including an aluminum layer, a titanium layer, and an aluminum layer.

The second pad layer 42 may be located directly on the first pad layer 41. For example, the second pad layer 42 may directly contact the first pad layer 41. The second pad layer 42 may have a larger area (and/or size) than that of the first pad layer 41. In this regard, as shown in FIG. 8, the second pad layer 42 extends further in a width direction (e.g., the x direction) past both edges of the first pad layer 41. Opposite side surfaces 41s1 and 41s2 of the first pad layer 41 corresponding to opposite edges of the first pad layer 41 and a top surface 41t of the first pad layer 41 may be covered by the second pad layer 42. The second pad layer 42 may cover (e.g., entirely cover) the top surface 41t of the first pad layer 41, and may cover (e.g., may entirely cover) the opposite side surfaces 41s1 and 41s2 of the first pad layer 41 located opposite to each other in the width direction (e.g., the x direction). Opposite peripheral portions of the second pad layer 42 may contact an inorganic insulating layer under (e.g., underneath) the first pad layer 41, for example, such as a top surface of the second interlayer insulating layer 207.

The second pad layer 42 may include a metal, such as aluminum (Al), copper (Cu), and/or titanium (Ti), and may have a single-layer structure or a multi-layered structure including one or more of the above metal materials. The second pad layer 42 may be formed in the same or substantially the same process as that of the data line DL and/or the vertical common voltage line VSL described above with reference to FIG. 4. The second pad layer 42 and the data line DL and/or the vertical common voltage line VSL described above with reference to FIG. 4 may be located at (e.g., in or on) the same layer as each other, and may include the same material as each other. For example, the second pad layer 42, the data line DL, and the vertical common voltage line VSL may include the same metal element as each other. In some embodiments, each of the second pad layer 42, the data line DL, and the vertical common voltage line VSL may have a three-layered structure including an aluminum layer, a titanium layer, and an aluminum layer.

The first pad PAD1 may include an outer area, and an inner area surrounded (e.g., around a periphery thereof) by the outer area. The insulating layer 213' may have the opening 213'OP overlapping with the inner area of the first pad PAD1. The insulating layer 213' may cover the outer area of the first pad PAD1. The opening 213'OP of the insulating layer 213' may be located at (e.g., in or on) an overlapping portion between the first pad layer 41 and the second pad layer 42 of the first pad PAD1.

The insulating layer 213' may be formed in the same or substantially the same process as that of the third organic insulating layer 213 described above with reference to FIG. 4. The insulating layer 213' and the third organic insulating layer 213 described above with reference to FIG. 4 may include the same material as each other. The insulating layer 213' may include an organic insulating material. The insulating layer 213' and the third organic insulating layer 213 may be formed in a process using a halftone mask, and a thickness t2 of the insulating layer 213' may be less than a thickness t1 (e.g., see FIG. 4) of the third organic insulating layer 213. Because the thickness t2 of the insulating layer 213' is less than the thickness t1 (e.g., see FIG. 4) of the third organic insulating layer 213, a step difference between the first pad PAD1 and the insulating layer 213' may be reduced, and an adhesive force between the first pad PAD1 and the counter pad CPAD (e.g., see FIG. 5D) of the printed circuit board 5000 may be increased.

Figure 9:
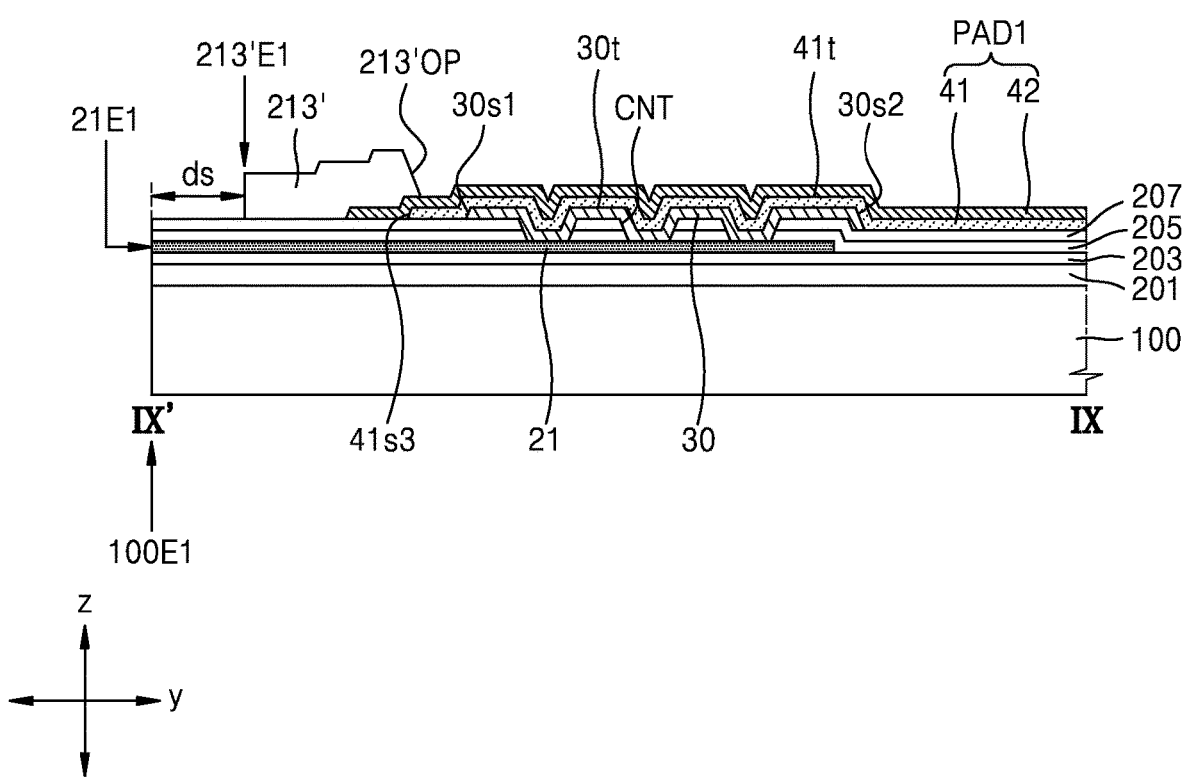
FIG. 9 is a cross-sectional view taken along the line IX-IX' of FIG. 7.

FIG. 9 is a cross-sectional view taken along the line IX-IX' of FIG. 7.

Referring to FIGS. 7 and 9, the first conductive line 21 may overlap with a part of the first pad PAD1 (e.g., a portion of the first pad PAD1 adjacent to the first edge 100E1 of the substrate 100), and may extend toward the first edge 100E1 of the substrate 100. In a cutting process using a laser along the cutting line CL described above with reference to FIG. 5A, the laser may pass through (e.g., may penetrate to cut) the first conductive line 21. Accordingly, an edge 21E1 of the first conductive line 21 and the first edge 100E1 of the substrate 100 may be aligned or substantially aligned with each other.

The first conductive line 21 may include a metal. The first conductive line 21 may include a conductive material including molybdenum (Mo), aluminum (Al), copper (Cu), or titanium (Ti), and may have a single-layer structure or a multi-layered structure including one or more of the above conductive materials. The first conductive line 21 may be formed in the same or substantially the same process as that of the driving gate electrode GE1 and/or the first capacitor electrode CE1 described above with reference to FIG. 4. The first conductive line 21 and the driving gate electrode GE1 and/or the first capacitor electrode CE1 described above with reference to FIG. 4 may be located at (e.g., in or on) the same layer as each other, and may include the same material as each other.

The second pad layer 42 of the first pad PAD1 may be located directly on the first pad layer 41. The second pad layer 42 may have a larger area (and/or size) than that of the first pad layer 41. In this regard, in FIG. 9, the second pad layer 42 further extends past an edge of the first pad layer 41 in a longitudinal direction (e.g., the y direction). A side surface 41s3 of the first pad layer 41 adjacent to the first edge 100E1 of the substrate 100 may be covered by the second pad layer 42. In other words, the second pad layer 42 may extend on the second interlayer insulating layer 207 to cover (e.g., to entirely cover) the top surface 41t of the first pad layer 41 and to cover (e.g., to entirely cover) the side surface 41s3 of the first pad layer 41.

The conductor 30 may be located between the first conductive line 21 and the first pad PAD1. The conductor 30 may include a metal, such as aluminum (Al), copper (Cu), and/or titanium (Ti), and may have a single-layer structure or a multi-layered structure including one or more of the above metal materials. The conductor 30 may be formed in the same or substantially the same process as that of the vertical driving voltage line VDL and/or the node connection line 166 described above with reference to FIG. 4. The conductor 30 and the vertical driving voltage line VDL and/or the node connection line 166 described above with reference to FIG. 4 may be located at (e.g., in or on) the same layer as each other, and may include the same material as each other. For example, each of the conductor 30, the vertical driving voltage line VDL, and the node connection line 166 may have a three-layered structure including an aluminum layer, a titanium layer, and an aluminum layer.

A bottom surface of the conductor 30 may directly contact a top surface of the first conductive line 21.

The bottom surface of the conductor 30 may directly contact the top surface of the first conductive line 21 through a contact hole CNT. The contact hole CNT may be formed in (e.g., may penetrate) an insulating layer between the first conductive line 21 and the conductor 30, for example, such as an inorganic insulating layer such as the first interlayer insulating layer 205 and the second interlayer insulating layer 207.

A top surface 30t of the conductor 30 may directly contact the first pad PAD1. A contact area between the bottom surface of the conductor 30 and the top surface of the first conductive line 21 may be less than a contact area between a top surface of the conductor 30 and a bottom surface of the first pad layer 41.

The bottom surface of the conductor 30 may not locally contact the top surface of the first conductive line 21 through the contact holes CNTs, and the entire top surface 30t of the conductor 30 may directly contact the first pad PAD1. In this regard, in FIG. 9, the first pad layer 41 covers the entire top surface 30t of the conductor 30, and contacts the entire top surface 30t of the conductor 30. The first pad layer 41 may extend to cover side surfaces 30s1 and 30s2 of the conductor 30, while contacting the top surface 30t of the conductor 30.

The conductor 30 may have a smaller area (and/or size) than that of the first pad PAD1, may overlap with the first pad PAD1, and may have an isolated shape in a plan view. In a comparative example, when the conductor 30 has the same or substantially the same size as that of the first pad layer 41 or the second pad layer 42, the first pad PAD1 may include or substantially include three pad layers. In this case, because a pad is excessively thick, it may be difficult to find an indentation (e.g., described above with reference to FIG. 5D) according to a thermo-compression process of the printed circuit board 5000 (e.g., see FIG. 5C). Also, according to the comparative example, cracks may occur due to a step difference between metal layers, or a step difference between a metal layer and an inorganic material layer, such as an inorganic insulating material, and the cracks may spread to the surroundings. However, according to an embodiment, the above described deficiencies of the comparative example may be prevented or minimized due to the structure shown in FIGS. 7 through 9.

The insulating layer 213' of the first pad PAD1 may cover an outer area of the first pad PAD1. The opening 213'OP of the insulating layer 213' may overlap with the first pad PAD1 and the conductor 30 under (e.g., underneath) the first pad PAD1. As described above, the thickness t2 of the insulating layer 213' is less than the thickness t1 of the third organic insulating layer 213 of the display area DA described above with reference to FIG. 4.

The first edge 100E1 of the substrate 100 may be formed through a laser cutting process as described above with reference to FIG. 5A. Because an organic material is more vulnerable to a laser than an inorganic material, an edge 213'E1 of the insulating layer 213' adjacent to the first edge 100E1 of the substrate 100 may be spaced apart by a first distance ds from the first edge 100E1 of the substrate 100. Accordingly, during the laser cutting process, damage to the insulating layer 213' by a laser may be prevented or substantially prevented.

The conductor 30 may be formed in the same or substantially the same process as that of the node connection line 166. The conductor 30 and the vertical driving voltage line VDL and/or the node connection line 166 described above with reference to FIG. 4 may be located at (e.g., in or on) the same layer as each other, and may include the same material as each other. For example, each of the conductor 30, the vertical driving voltage line VDL, and the node connection line 166 may have a three-layered structure including an aluminum layer, a titanium layer, and an aluminum layer.

A bottom surface of the conductor 30 may directly contact a top surface of the first conductive line 21.

The bottom surface of the conductor 30 may directly contact the top surface of the first conductive line 21 through the contact hole CNT. The contact hole CNT may be formed in (e.g., may penetrate) an insulating layer between the first conductive line 21 and the conductor 30, for example, such as an inorganic insulating layer such as the first interlayer insulating layer 205 and the second interlayer insulating layer 207.

The top surface 30t of the conductor 30 may directly contact the first pad PAD1. A contact area between the bottom surface of the conductor 30 and the top surface of the first conductive line 21 may be less than a contact area between a top surface of the conductor 30 and a bottom surface of the first pad layer 41.

The bottom surface of the conductor 30 may not locally contact the top surface of the first conductive line 21 through the contact holes CNTs, and the entire top surface 30t of the conductor 30 may directly contact the first pad PAD1. In this regard, in FIG. 9, the first pad layer 41 covers the entire top surface 30t of the conductor 30 and contacts the entire top surface 30t of the conductor 30. The first pad layer 41 may extend to cover the side surfaces 30s1 and 30s2 of the conductor 30, while contacting the top surface 30t of the conductor 30.

The conductor 30 may have a smaller area (and/or size) than that of the first pad PAD1, may overlap with the first pad PAD1, and may have an isolated shape in a plan view. In a comparative example of the disclosure, when the conductor 30 has substantially the same size as that of the first pad layer 41 or the second pad layer 42, the first pad PAD1 may include substantially three pad layers. In this case, because a pad is excessively thick, it is difficult to find an indentation (described with reference to FIG. 5D) according to a thermo-compression process of the printed circuit board 5000 (see FIG. 5C). Also, according to the comparative example, cracks may occur due to a step difference between metal layers or a step difference between a metal layer and an inorganic material layer such as an inorganic insulating material, and the cracks may spread to the surroundings. However, according to an embodiment, the above problems may be prevented or minimized through the structure as shown in FIGS. 7 through 9.

The insulating layer 213' of the first pad PAD1 may cover an outer area of the first pad PAD1. The opening 213'OP of the insulating layer 213' may overlap the first pad PAD1 and the conductor 30 under the first pad PAD1. As described above, the thickness t2 of the insulating layer 213' is less than the thickness t1 of the third organic insulating layer 213 of the display area DA described with reference to FIG. 4.

The first edge 100E1 of the substrate 100 may be formed through a laser cutting process described with reference to FIG. 5A. Because an organic material is more vulnerable than an inorganic material, the edge 213'E1 of the insulating layer 213' adjacent to the first edge 100E1 of the substrate 100 may be spaced apart by the first distance ds from the first edge 100E1 of the substrate 100. Accordingly, during the laser cutting process, damage to the insulating layer 213' by a laser may be prevented.

Figure 10:
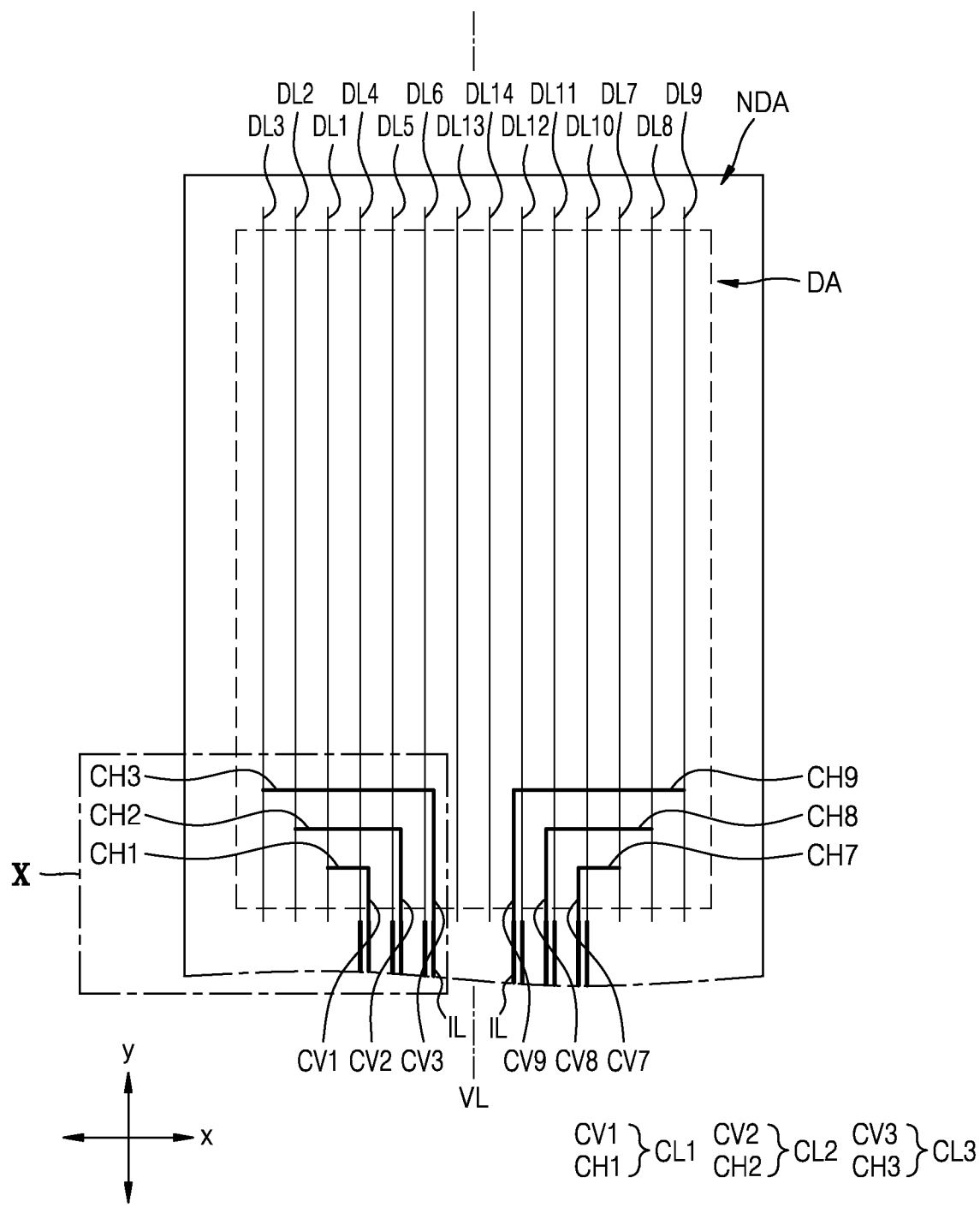
FIG. 10 is a plan view illustrating a connection of data lines of a display apparatus, according to an embodiment.
Figure 11:
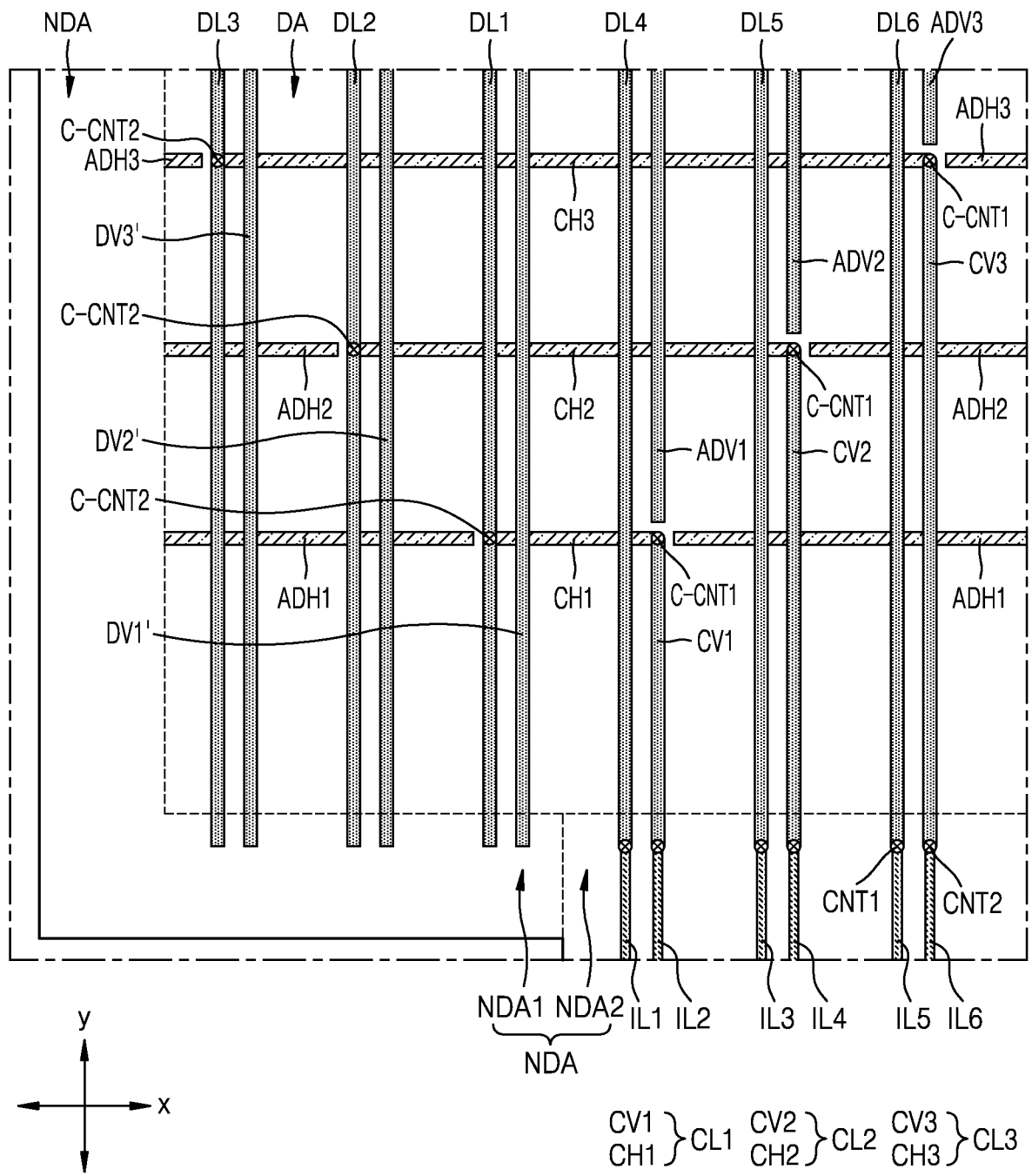
FIG. 11 is an enlarged plan view illustrating the portion X of FIG. 10.

FIG. 10 is a plan view illustrating a connection of data lines of a display apparatus, according to an embodiment. FIG. 11 is an enlarged plan view illustrating the portion X of FIG. 10.

Referring to FIG. 10, data lines may extend to cross the display area DA in the y direction (e.g., a first direction). The data lines crossing the display area DA in the first direction may be connected to data input lines IL located at (e.g., in or on) the non-display area NDA, as shown in FIG. 10. For convenience of illustration and description, the following will be described assuming that the data lines in FIG. 10 include first through 14$^{th}$ data lines DL1 through DL14.

As the area of the non-display area NDA corresponding to a dead area may be reduced, and the data input lines IL may be located at (e.g., in or on) a portion (e.g., a portion corresponding to the sub-region SR shown in FIG. 1) of the non-display area NDA.

Some of the first through 14$^{th}$ data lines DL1 through DL14 may be directly connected to the data input lines IL, and some others of the first through 14$^{th}$ data lines DL1 through DL14 may be connected to the data input lines IL through connection lines.

Referring to FIGS. 10 and 11, the first data line DL1 may be electrically connected to the data input line IL through a first connection line CL1 including a first vertical connecting portion CV1 and a first horizontal connecting portion CH1. The first connection line CL1 may be located at (e.g., in or on) the display area DA. For example, the first vertical connecting portion CV1 of the first connection line CL1 may extend in the first direction at (e.g., in or on) the display area DA, and the first horizontal connecting portion CH1 may extend in the second direction at (e.g., in or on) the display area DA.

The first vertical connecting portion CV1 of the first connection line CL1 may be located at (e.g., in or on) the same layer (e.g., on the second organic insulating layer 212 described above with reference to FIG. 4) as that of the first data line DL1. The first horizontal connecting portion CH1 of the first connection line CL may be located at (e.g., in or on) the same layer (e.g., on the first organic insulating layer 211 described above with reference to FIG. 4) as that of the horizontal common voltage line HSL.

The first vertical connecting portion CV1 may be located at (e.g., in or on) a different layer from that of the first data input line IL1, and may be connected to the first data input line IL1 through a second contact hole CNT2 passing through (e.g., penetrating) at least one insulating layer located between the first vertical connecting portion CV1 and the first data input line IL1.

The first vertical connecting portion CV1 and the first horizontal connecting portion CH1 located at (e.g., in or on) different layers from each other may be connected to each other through a first connection contact hole C-CNT1 passing through (e.g., penetrating) at least one insulating layer (e.g., the second organic insulating layer 212 described above with reference to FIG. 4) located between the first vertical connecting portion CV1 and the first horizontal connecting portion CH1.

The first horizontal connecting portion CH1 is located at (e.g., in or on) a different layer from that of the first data line DL1. The first horizontal connecting portion CH1 may be connected to the first data line DL1 through a second connection contact hole C-CNT2 passing through (e.g., penetrating) at least one insulating layer (e.g., the second organic insulating layer 212 described above with reference to FIG. 4) located between the first horizontal connecting portion CH1 and the first data line DL1.

The second data line DL2 may be electrically connected to the data input line IL through a second connection line CL2 including a second vertical connecting portion CV2 and a second horizontal connecting portion CH2. The second vertical connecting portion CV2 and the second horizontal connecting portion CH2, and the first vertical connecting portion CV1 and the first horizontal connecting portion CH1 may be located at (e.g., in or on) the same layer as one another, and may have the same or substantially the same connection structure as one another.

An end portion of the second vertical connecting portion CV2 of the second connection line CL2 may be connected to the data input line IL, and the other end portion of the second vertical connecting portion CV2 may be connected to an end portion of the second horizontal connecting portion CH2 through the first connection contact hole C-CNT1. The other end portion of the second horizontal connecting portion CH2 may be connected to the second data line DL2 through the second connection contact hole C-CNT2.

The third data line DL3 may be electrically connected to the data input line IL through a third connection line CL3 including a third vertical connecting portion CV3 and a third horizontal connecting portion CH3. The third vertical connecting portion CV3 and the third horizontal connecting portion CH3, and the first vertical connecting portion CV21 and the first horizontal connecting portion CH1 may be located at (e.g., in or on) the same layer as one another, and may have the same or substantially the same connection structure as one another.

An end portion of the third vertical connecting portion CV3 of the third connection line CL3 may be connected to a third data input line IL3, and the other end portion of the third vertical connection portion CV3 may be connected to an end portion of the third horizontal connecting portion CH3 through the first connection contact hole C-CNT1. The other end portion of the third horizontal connecting portion CH3 may be connected to the third data line DL3 through the second connection contact hole C-CNT2.

A voltage line having a certain voltage may be located around a vertical connecting portion and/or a horizontal connecting portion of each of the first connection line CL1, the second connection line CL2, and the third connection line CL3. For example, a first vertical auxiliary voltage line ADV1 may be located in the same column as that of the first vertical connecting portion CV1, and a first horizontal auxiliary voltage line ADH1 may be located in the same row as that of the first horizontal connecting portion CH1. The first horizontal auxiliary voltage line ADH1 and the first vertical auxiliary voltage line ADV1 may have a constant or substantially constant voltage level. In some embodiments, the first vertical auxiliary voltage line ADV1 may have the same or substantially the same voltage level as that of the vertical common voltage line VSL described above with reference to FIG. 1. The first horizontal auxiliary voltage line ADH1 may have the same or substantially the same voltage level as that of the horizontal common voltage line HSL or the horizontal driving voltage line HDL described above with reference to FIG. 1.

Similarly, a second vertical auxiliary voltage line ADV2 may be located in the same column as that of the second vertical connecting portion CV2, and a second horizontal auxiliary voltage line ADH2 may be located in the same row as that of the second horizontal connecting portion CH2. The second horizontal auxiliary voltage line ADH2 and the second vertical auxiliary voltage line ADV2 may have a constant or substantially constant voltage level. In some embodiments, the second vertical auxiliary voltage line ADV2 may have the same or substantially the same voltage level as that of the vertical common voltage line VSL described above with reference to FIG. 1. The second horizontal auxiliary voltage line ADH2 may have the same or substantially the same voltage level as that of the horizontal common voltage line HSL or the horizontal driving voltage line HDL described above with reference to FIG. 1.

A third vertical auxiliary voltage line ADV3 may be located in the same column as that of the third vertical connecting portion CV3, and a third horizontal auxiliary voltage line ADH3 may be located in the same row as that of the third horizontal connecting portion CH3. The third horizontal auxiliary voltage line ADH3 and the third vertical auxiliary voltage line ADV3 may have a constant or substantially constant voltage level. In some embodiments, the third vertical auxiliary voltage line ADV3 may have the same or substantially the same voltage level as that of the vertical common voltage line VSL described above with reference to FIG. 1. The third horizontal auxiliary voltage line ADH3 may have the same or substantially the same voltage level as that of the horizontal common voltage line HSL or the horizontal driving voltage line HDL described above with reference to FIG. 1.

The first vertical auxiliary voltage line ADV1, the second vertical auxiliary voltage line ADV2, and the third vertical auxiliary voltage line ADV3 may have different lengths from one another. For example, as shown in FIG. 11, the lengths may be reduced in the order of the first vertical auxiliary voltage line ADV1, the second vertical auxiliary voltage line ADV2, and the third vertical auxiliary voltage line ADV3. Each of first through third vertical voltage lines DV1', DV2', and DV3' respectively located adjacent to the first through third data lines DL1, DL2, and DL3, the first vertical auxiliary voltage line ADV1, and the second vertical auxiliary voltage line ADV2 may overlap with at least one horizontal connecting portion located thereunder.

The first horizontal auxiliary voltage line ADH1, the second horizontal auxiliary voltage line ADH2, and the third horizontal auxiliary voltage line ADH3 may have different lengths from one another. For example, as shown in FIG. 11, the lengths may be reduced in the order of the first horizontal auxiliary voltage line ADH1, the second horizontal auxiliary voltage line ADH2, and the third horizontal auxiliary voltage line ADH3.

A structure of the first through sixth data lines DL1 through DL6 and the first through third connection lines CL1, CL2, and CL3 described above with reference to FIGS. 10 and 11 may also be applied to the data lines illustrated on the right of the virtual line VL of FIG. 10.

In other words, seventh through ninth vertical connecting portions CV7 through CV9 and seventh through ninth horizontal connecting portions CH7 through CH9 connected to the seventh through ninth data lines DL7 through DL9 and a surrounding structure thereof may be the same or substantially the same as the first through third vertical connecting portions CV1 through CV3 and the first through third horizontal connecting portions CH1 through CH3 connected to the first through third data lines DL1 through DL3 and a surrounding structure thereof of FIGS. 10 and 11.

In some embodiments, as shown in FIG. 10, the first through third vertical connecting portions CV1 through CV3 and the seventh through ninth vertical connecting portions CV7 through CV9 may be symmetrical or substantially symmetrical relative to the virtual line VL extending in the y direction. Similarly, the first through third horizontal connecting portions CH1 through CH1 and the seventh through ninth horizontal connecting portions CH7 through CH9 may be symmetrical or substantially symmetrical relative to the virtual line VL.

According to an embodiment, a display apparatus including a pad that may be used for inspection of the display apparatus while minimizing or reducing damage thereto may be provided. However, the aspects and features of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate;
   a plurality of sub-pixel circuits on the substrate, each of the plurality of sub-pixel circuits comprising at least one transistor;
   a plurality of light-emitting diodes electrically connected to the plurality of sub-pixel circuits, respectively, and defining a display area;
   a pad at a non-display area outside the display area;
   a conductive line extending toward a first edge of the substrate; and
   a conductor electrically connecting the conductive line to the pad,
   wherein the conductor overlaps with the pad, is interposed between a part of the conductive line and a part of the pad, and has an isolated shape in a plan view.

2. The display apparatus of claim 1, wherein an entirety of a top surface of the conductor directly contacts the pad.

3. The display apparatus of claim 1, wherein the pad comprises:
   a first pad layer on the conductor; and
   a second pad layer on the first pad layer.

4. The display apparatus of claim 3, further comprising at least one inorganic insulating layer between the conductor and the conductive line, wherein the conductor is connected to the conductive line through a contact hole penetrating the at least one inorganic insulating layer.

5. The display apparatus of claim 3, wherein the first pad layer extends past an edge of the conductor, and a side surface of the conductor corresponding to the edge of the conductor is covered by the first pad layer.

6. The display apparatus of claim 3, wherein the second pad layer extends past an edge of the first pad layer, and a side surface of the first pad layer corresponding to the edge of the first pad layer is covered by the second pad layer.

7. The display apparatus of claim 1, wherein an edge of the conductive line and the first edge of the substrate are aligned with each other.

8. The display apparatus of claim 1, further comprising an insulating layer covering an outer area of the pad, and having an opening exposing a part of the pad.

9. The display apparatus of claim 8, wherein an edge of the insulating layer adjacent to the first edge of the substrate is spaced from the first edge of the substrate.

10. The display apparatus of claim 8, wherein each of the plurality of sub-pixel circuits comprises:
a driving transistor comprising a driving semiconductor layer, and a driving gate electrode on the driving semiconductor layer; and
a storage capacitor comprising a first electrode overlapping with the driving semiconductor layer of the driving transistor, and a second electrode on the first electrode,
wherein each of the plurality of sub-pixel circuits is electrically connected to:
a corresponding driving voltage line; and
a corresponding data line located on the corresponding driving voltage line and underneath a first electrode of a corresponding light-emitting diode of the plurality of light-emitting diodes, and
wherein the insulating layer and an organic insulating layer located between the corresponding data line and the first electrode include a same material as each other.

11. The display apparatus of claim 10, wherein each of the plurality of sub-pixel circuits further comprises a compensation transistor electrically connected to the driving transistor through a node connection line,
wherein the conductor is located at a same layer as that of the node connection line.

12. A display apparatus comprising:
a substrate;
a plurality of sub-pixel circuits on the substrate, each of the sub-pixel circuits comprising at least one transistor;
a plurality of light-emitting diodes electrically connected to the plurality of sub-pixel circuits, respectively, and defining a display area;
a pad at a non-display area outside the display area, and comprising a first pad layer and a second pad layer;
a conductive line extending toward a first edge of the substrate; and
a conductor electrically connecting the conductive line to the pad,
wherein the conductor overlaps with the first pad layer and the second pad layer, is interposed between a part of the conductive line and a part of the pad, and has an isolated shape in a plan view.

13. The display apparatus of claim 12, wherein a contact area between a bottom surface of the conductor and the conductive line is smaller than a contact area between a top surface of the conductor and the pad.

14. The display apparatus of claim 12, wherein the second pad layer directly contacts an entirety of a top surface of the first pad layer, and the first pad layer directly contacts an entirety of a top surface of the conductor.

15. The display apparatus of claim 12, further comprising at least one inorganic insulating layer between the conductor and the conductive line,
wherein the conductor is connected to the conductive line through a contact hole penetrating the at least one inorganic insulating layer.

16. The display apparatus of claim 12, wherein the first pad layer extends past edges of the conductor, and side surfaces of the conductor corresponding to the edges of the conductor are covered by the first pad layer.

17. The display apparatus of claim 12, wherein the second pad layer extends past an edge of the first pad layer, and a side surface of the first pad layer corresponding to the edge of the first pad layer is covered by the second pad layer.

18. The display apparatus of claim 12, wherein an edge of the conductive line and the first edge of the substrate are aligned with each other.

19. The display apparatus of claim 12, further comprising an insulating layer covering an outer area of the pad, and having an opening exposing a part of the pad,
wherein an edge of the insulating layer adjacent to the first edge of the substrate is spaced from the first edge of the substrate.

20. The display apparatus of claim 19, wherein each of the plurality of sub-pixel circuits comprises:
a driving transistor comprising a driving semiconductor layer, and a driving gate electrode on the driving semiconductor layer; and
a storage capacitor comprising a first electrode overlapping with the driving semiconductor layer of the driving transistor, and a second electrode on the first electrode,
wherein each of the plurality of sub-pixel circuits is electrically connected to:
a corresponding driving voltage line; and
a corresponding data line located on the corresponding driving voltage line, and underneath a first electrode of a corresponding light-emitting diode of the plurality of light-emitting diodes, and
wherein the insulating layer and an organic insulating layer located between the corresponding data line and the first electrode include a same material as each other.

* * * * *